United States Patent
Sakurai et al.

(10) Patent No.: US 6,828,588 B2
(45) Date of Patent: Dec. 7, 2004

(54) PROTECTIVE FILM FOR FPD, VAPOR DEPOSITION MATERIAL FOR PROTECTIVE FILM AND ITS PRODUCTION METHOD, FPD, AND MANUFACTURING DEVICE FOR FPD PROTECTIVE FILM

(75) Inventors: Hideaki Sakurai, Saitama (JP); Yoshirou Kuromitsu, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/901,908

(22) Filed: Jul. 11, 2001

(65) Prior Publication Data

US 2002/0074623 A1 Jun. 20, 2002

(30) Foreign Application Priority Data

| Jul. 12, 2000 | (JP) | ................................. P2000-210667 |
| Oct. 2, 2000 | (JP) | ................................. P2000-302404 |
| Jan. 25, 2001 | (JP) | ................................. P2001-016910 |
| May 31, 2001 | (JP) | ................................. P2001-163910 |

(51) Int. Cl.[7] .............................................. H01L 27/15
(52) U.S. Cl. ......................................................... 257/79
(58) Field of Search .................. 257/79, 632; 313/509; 445/24

(56) References Cited

U.S. PATENT DOCUMENTS

| 5,462,922 A | * | 10/1995 | Doi et al. .................... 505/785 |
| 5,496,583 A | * | 3/1996 | Jansen et al. ................ 427/109 |
| 5,891,531 A | * | 4/1999 | Konishi et al. .............. 427/564 |

FOREIGN PATENT DOCUMENTS

| JP | 6-26206 | 4/1994 | | |
| JP | 09-040881 | 2/1997 | | |
| JP | 2741546 | 1/1998 | | |
| JP | 10-101830 | 4/1998 | | |
| JP | 41049767 A | * 6/1998 | ............. | H01J/9/02 |
| JP | 10-182861 | 7/1998 | | |
| JP | 10-204195 | 8/1998 | | |
| JP | 10-512100 | 11/1998 | | |
| JP | 2000-331601 A | * 11/2000 | ........... | C23C/14/08 |
| JP | 2001-035382 A | * 2/2001 | ............. | H01J/9/02 |
| WO | WO 87/01508 | 3/1987 | | |
| WO | WO 96/19825 | 6/1996 | | |

OTHER PUBLICATIONS

John L.. Vossen Thin Film processes Acedemic Press 1978 pp. 438–439.*

The Seventh Fine Process Technology Japan '97 Seminar Preliminary Report D5, (1997) pp. 1–16 (English Translation).

Monthly Semiconductor World, [3], (1988), p. 121, left col., line 8 to right col., second line from the bottom, p. 122, left col., lines 18–21, lines 31 and 32, lines 23–34 (partial English translation).

Excalibur Paper Phase Cleaning System Described in the Catalog of MFSI Co., Ltd., p. 2, lines 2 and 3 (partial English Translation).

(List continued on next page.)

*Primary Examiner*—David S. Blum
(74) *Attorney, Agent, or Firm*—Oblon, Spivak, McClelland, Maier & Neustadt, P.C.

(57) ABSTRACT

A vapor deposited material for FPD protective film comprises a polycrystalline body, sintered body, or single crystal having a surface covered with a fluoride layer. A manufacturing device for FPD protective film comprises: a film formation section for forming a film body on one side of a substrate, and a layer formation section for forming a fluoride layer on a surface of said film body; wherein said layer formation section comprises: a layer formation chamber for housing a substrate on which said film body is formed, a gas supply mechanism for forming a fluoride layer on the surface of said film body by supplying a fluoridation agent towards said substrate in said layer formation chamber, and a substrate heating section provided in said layer formation chamber for heating said substrate.

13 Claims, 8 Drawing Sheets

OTHER PUBLICATIONS

The Latest Plasma Display Manufacturing Technology, Press Journal, Inc., Dec. 1, 1997, p. 120, lines 17 to 24; p. 120, Figure 4, p. 291, right col., last line to p. 292, line 7 (partial English translation).

Preparation of MgO Protective Films for Plasma Display Panels using Vacuum Deposition Methods, ULVAC Technical Journal, No. 46, 1997, p. 8, left col., lines 15–17, Figure 1 (partial English translation).

Cathode Materials for Color Plasma Displays, O Plus E, Feb. 1996., p. 92, right col., line 5 from the bottom, to p. 93 right col., line 23 (partial English translation).

H., Seehase, "Plasma Display Panel MgO Thin Film Properties and Their Modification by Low Energy Ion Bombardment", Displays, Jan. 1985, pp. 21–34.

Monthly Semiconductor World, [3], pp. 121–123 (1998), Japanese Language Only.

Excalibur Paper Phase Cleaning System Described in the Catalog of MFSI Co., Ltd., Japanese Language Only.

FALCON HF Reduced Pressure Gas Phase Etching System Described in the Catalog of ASM Japan Co., Ltd., Japanese Language Only.

M.N. Abraham, et al., "Growth of High Purity and Doped Alkaline Earth Oxides: I. MgO and CaO," The Journal of Chemical Physics, 35 [8], pp. 3752–3756 (1971).

Lee, W.T., "Study of Protective Layers in AC–PDPs", IDW 99, pp. 763–766.

"Preparation of MgO Protective Films for Plasma Display Panels Using Vacuum Depostion Methods", ULVAC Technical Journal, No. 46, 1997, pp. 8–13, Japanese Language Only.

"Cathode Materials for Color Plasma Displays", O Plus E, Feb. 1996, Japanese Language Only.

* cited by examiner

PROTECTIVE FILM FOR FPD, VAPOR DEPOSITION MATERIAL FOR PROTECTIVE FILM AND ITS PRODUCTION METHOD, FPD, AND MANUFACTURING DEVICE FOR FPD PROTECTIVE FILM

BACKGROUND OF THE INVENTION

1. Field of the Invention

The present invention relates to a protective film for a flat panel display (FPD) such as a plasma display panel (PDP), a plasma addressed liquid crystal display (PALC), and the like and an FPD in which the protective film is used, a vapor deposition material suitable for forming a protective film for FPD and its production method, and a device for manufacturing an FPD protective film.

2. Description of Related Art

During the past several years, there has been considerable activity in the research and development as well as practical application of liquid crystal displays (LCD) and various other types of flat displays, and production of these displays is also increasing rapidly. There has recently also been growing activity in the development and practical application of color plasma display panels (PDP). PDP are easily applied to large screens, and are the easiest way to achieve large-screen wall-mounted televisions for Hi-Vision applications, and prototypes of PDP offering a diagonal size of 40 inches have already been developed. In the case of FPD, which include these PDP, the glass dielectric layer is directly exposed to electrical discharge, and the surface of the dielectric layer changes due to sputtering of ion collisions resulting in a rise in the discharge starting voltage. Consequently, various oxides having a high heat of sublimation have been used as protective films.

In the past, known examples of depositing this protective film included methods involving the formation of an FPD protective film using a vacuum process such as electron beam vapor deposition, sputtering and ion plating. In the case of electron beam vapor deposition and ion plating, the vapor deposition material serving as the raw material for forming the protective film, and the FPD on which the protective film is formed, are placed in a vacuum container, the vapor deposition material is heated under a high vacuum, or evaporated using an electron beam or plasma, and the vapor is agglutinated in the form of a thin film on the surface of the FPD.

On the other hand, since a PDP protective film is in direct contact with the discharge space, it serves as the key material for fulfilling the most important role for discharge characteristics, and an MgO film was used in the past due to its high secondary electron discharge capabilities and superior sputtering resistance, light transmission and insulating properties.

However, if this MgO film is exposed to the atmosphere during the course of processing, it deteriorates easily as a result of reacting with $CO_2$ and $H_2O$. Therefore, it is known that degassing exhaust treatment over a long period of time while heating in a vacuum after sealing the film on the panel is required in order to obtain the inherent characteristics of MgO (see, for example, Sato, ed., Current Plasma Display Production Technology (Press Journal Co., Ltd.): p. 118–123 and p. 291–295 (1997)). According to this, impurity gases such as $H_2O$, $H_2$, $O_2$, CO, $CO_2$ and $N_2$ have a detrimental effect on PDP discharge characteristics and composite materials in the panel, and contamination by $CO_2$ in particular can worsen panel characteristics beyond recovery.

Consequently, the coating of the MgO surface with another material having low moisture permeability has been proposed in order to prevent deterioration of MgO (Japanese Unexamined Patent Application, First Publication No. 10-149767, W. T. Lee et al.: "$LaF_3$ coated MgO protecting layer in AC-Plasma Display Panels", IDW '99, p. 72–75).

The above Japanese Unexamined Patent Application, First Publication No. 10-149767 proposes a PDP production method consisting of forming a protective film followed by temporarily forming a protective film having a low moisture permeability on this protective film, and then removing that temporary protective film. According to this method, during production of the PDP, since the surface of the protective film is protected by a temporary protective film, a deteriorated layer is not formed on the surface of the protective film. As a result, in addition to being able to obtain a protective film with satisfactory discharge characteristics, thermal decomposition treatment of a deteriorated layer on the protective film is not required.

In addition, in the above reference of W. T. Lee et al, together with suppressing deterioration of the MgO protective film by coating $LaF_3$ having low moisture permeability onto an MgO protective film, it is proposed that higher secondary electron discharge characteristics and lower discharge characteristics can be realized.

However, in the production methods described in the above-mentioned Japanese Unexamined Patent Application, First Publication No. 10-149767 and the reference of W. T. Lee et al. of the prior art, it is difficult to conform the temporary protective film with the protective film when forming the temporary protective film, and there are cases in which cracks may form in the temporary protective film or the temporary protective film may peel off, thus making the effect of the temporary protective for preventing deterioration of the protective film inadequate. In order to improve this, although a method was considered in which a temporary protective film is laminated in a thick layer onto a protective film, in this method, there was the problem of a large amount of impurities (decomposition products of the temporary protective film) being formed during removal of the temporary protective film.

Moreover, in the above reference of W. T. Lee et al., 5–90 nm of $LaF_3$ are laminated onto MgO and in this double layer structure, when the $LaF_3$ of the upper layer film is removed by sputtering, there was the problem of an adequate lifetime being unable to be obtained due to sudden changes in the discharge voltage In addition, alkaline earth metal oxides are used as vapor deposition materials that serve as the raw materials for forming a superior protective film as described above.

However, similar to MgO films, if these alkaline earth metal oxides are exposed to the atmosphere before being used as vapor deposition materials, they are easily deteriorated as a result of reacting with $CO_2$ and $H_2O$. Consequently, it is known that, after placing vapor deposition materials comprised of alkaline earth metal oxides in a vacuum container, degassing exhaust treatment for a long period of time while heating in a vacuum is required. Namely, if degassing exhaust treatment is not performed for a comparative long period of time, impurity gases such as $H_2O$, $H_2$, $O_2$, CO, $CO_2$ and $N_2$ generated in large amounts from the deteriorated surface of the vapor deposition material cause problems in the characteristics of the resulting protective film.

In addition, as an example of a manufacturing device for producing a protective film as described above, a manufacturing device for FPD protective films is disclosed comprising coupling a loading chamber that loads substrate onto a line, a heating chamber that heats the substrates, a film formation chamber in which a film body is formed on one surface of the substrates, a cooling chamber that cools the substrates, and an unloading chamber that unloads substrates from the line, without exposing them to the atmosphere (inline system), whereby a protective film is formed by electron beam vapor deposition and so forth at a predetermined region on the substrates (see, for example, Ulvac Technical Journal, No. 46, pp. 8–13 (1997), $7^{th}$ Fine Process Technology Japan '97 Seminar preliminary collection of papers, D5, pp. 35–42 (1997)). In a manufacturing device for FPD protective film composed in this manner, since the process is carried out from loading to unloading of substrates without exposing the process to the atmosphere, improved productivity and conservation of space can be realized.

On the other hand, as examples of an apparatus for treating materials with a gaseous fluoridation agent, a dry etching apparatus that performs treatment with a mixed gas of $H_F$ and $H_2O$ for removing silicon oxide films on silicon wafers (see, for example, Japanese Patent Publication No. 2741546, Published Japanese Translation No. 6-26206 of PCT International Publication, Monthly Semiconductor World, [3], pp. 121–123 (1988), the Excalibur paper phase cleaning system described in the catalog of MFSI Co., Ltd., and the Falcon HF reduced pressure gas phase etching system described in the catalog of ASM Japan Co., Ltd.), and a surface treatment method and its apparatus for surface treatment of polyolefin resin molded products, polypropylene resin, carbon black and plastic molded products with a mixed gas containing fluorine, are disclosed (see Japanese Unexamined Patent Application, First Publication No. 10-101830, Japanese Unexamined Patent Application, First Publication No. 10-204195, Japanese Unexamined Patent Application, First Publication No. 940881 and Japanese Unexamined Patent Application, First Publication No. 10-182861).

In the above-mentioned dry etching apparatus for silicon wafers, dynamic systems, in which after performing treatment by introducing a gaseous fluoridation agent at a constant concentration into the system at nearly atmospheric pressure, inert gas is introduced followed by removal of residual gas, and closed systems, in which treatment is performed by introducing a gaseous fluoridation agent at a constant pressure into the reaction under a vacuum, returning the system to a vacuum, and after removing the residual gaseous fluoridation agent, inert gas is introduced and the system is returned to atmospheric pressure, have been proposed. These apparatuses allow selective etching of various types of silicon oxide films on silicon wafers by optimizing the mixing ratio of HF and $H_2O$, HF concentration or HF partial pressure, reaction temperature, reaction time and so forth. Moreover, this dry etching apparatus enables particle generation to be reduced in comparison with wet etching. In addition, in the method and its apparatus for surface treatment of polyolefin molded products, polypropylene resin, carbon black and plastic molded products, etc. with a mixed gas containing fluorine, by making the surface of the treated material hydrophilic, dispersivity in aqueous solutions as well as coating, adhesion and other characteristics can be improved.

However, in the above manufacturing device for FPD protective film of the prior art, there is the risk of the protective film easily deteriorating as a result of reacting with $CO_2$ and $H_2O$ if the protective film is exposed to the atmosphere after forming. In order to prevent this deterioration of the protective film, a method and apparatus have been considered that contact the protective film with a gaseous fluoridation agent to form a fluoride film on the surface of the protective film. However, in this fluorinating treatment method and apparatus, since FPD substrates are typically formed from glass, the substrate easily corrodes and becomes clouded, namely there was the problem of the FPD display surface and outgoing circuits around the FPD protective film ending up being clouded.

On the other hand, a treatment apparatus and method are disclosed composed such that substrates are placed nearly level in a chamber isolated from the surrounding environment, and regulatory gas containing a reactive gas is fed into the chamber to regulate the substrates (Published Japanese Translation No. 10-512100 of PCT International Publication). In this apparatus, a high-pressure gas inlet region into which regulatory gas is introduced is formed in the upper portion of the chamber, and a low-pressure regulation chamber that houses substrates in the center of the chamber is formed that regulates the substrates with the above regulatory gas. The above gas inlet region and regulation chamber are partitioned by a first pressure bias means comprised of a porous plate. In addition, a second pressure bias means is provided in the lower portion of the chamber that directs the flow of regulatory gas on the surface of the substrates to the outside and causes it to move in the direction of the outer periphery of the substrates, while an exhaust outlet is provided around or in the center of the lower end of the above substrates that discharges the above regulatory gas. This exhaust outlet is connected to an exhaust means.

In the treatment apparatus composed in this manner, high-pressure regulatory gas that has entered the chamber from the gas inlet portion is reduced to low pressure by the first pressure bias means and becomes a viscous flow. After chemically reacting with the substrate surface, it uniformly flows to the outside of the substrate surface and is discharged through an exhaust outlet around or in the center of the lower end. As a result, even in the above treatment apparatus, there was the problem that, although corrosion of the bottom surface of the substrate can be prevented, if regulatory gas makes contact with the portion at which the FPD protective film is not formed on the ends of the substrate surface in the same manner as described above, namely the outgoing circuits, and gaseous fluoridation agent is contained in the regulatory gas, the ends of the substrate surface end up being corroded.

BRIEF SUMMARY OF THE INVENTION

In consideration of the above problems, a first object of the present invention is to provide a vapor deposition material for an FPD protective film and its production method that enables the degassing exhaust treatment time immediately after placing in a container to be shortened.

A second object of the present invention is to provide a vapor deposition material for an FPD protective film and its production process that enables the formation of a film having stable and uniform characteristics.

A third object of the present invention is to provide an FPD protective film that prevents decreases in adhesion and conformity with a substrate (dielectric layer) while also preventing decreases in electrical insulating properties.

A fourth object of the present invention is to provide an FPD protective film that improves the environmental resistance of a film body, namely inhibits or suppresses MgO and so forth from decomposing into $MgCO_3$, $Mg(OH)_2$ and other substances harmful to FPD by a fluoride layer inhibiting or suppressing the reaction of MgO and so forth in the film body with $CO_2$ gas and $H_2O$ gas in the atmosphere during the FPD production process.

A fifth object of the present invention is to provide an FPD using a protective film that significantly reduces the number of production steps.

A sixth object of the present invention is to provide a manufacturing device for FPD protective film that prevents corrosion of the display surface or outgoing circuits around the film body of a substrate by a gaseous fluoridation agent during formation of a fluoride layer.

A seventh object of the present invention is to provide a manufacturing device for FPD protective film that continuously carries out formation of a film body and fluoride layer.

An eighth object of the present invention is to provide a manufacturing device for FPD protective film that prevents deterioration in the FPD production process caused by MgO in the film body reacting with $CO_2$ gas and $H_2O$ gas in the atmosphere.

In order to achieve the above objects, the present invention provides a vapor deposition material for FPD protective film that is formed from a polycrystalline body, a sintered body, or single crystal having a surface covered with a fluoride layer.

Consequently, since the surface of the polycrystalline body, sintered body, or single crystal is covered with a fluoride layer, the polycrystalline body, sintered body, or single crystal hardly reacts at all with $CO_2$ gas or $H_2O$ gas in the atmosphere even this vapor deposition material is exposed to the atmosphere for a long period of time. As a result, the amount of harmful substances generated after placing this vapor deposition material in a vacuum deposition container is suppressed to below that of the prior art, and the amount of time for degassing exhaust treatment that has conventionally been carried out to remove these harmful substances can be shortened, or the gas treatment step can be omitted, thereby making it possible to reduce FPD production costs to below the level of the prior art.

In addition, the above polycrystalline body, sintered body, or single crystal may be formed from one type or two or more types of oxides selected from MgO, CaO, SrO, BaO, alkaline earth composite oxides, rare earth oxides, and composite oxides of alkaline earth oxides and rare earth oxides.

In addition, the above fluoride layer may be obtained by reacting a fluoridation agent with one type or two or more types of oxides selected from MgO, CaO, SrO, BaO, alkaline earth composite oxides, rare earth oxides, and composite oxides of alkaline earth oxides and rare earth oxides.

As a result of employing these constitutions, since the vapor deposition material evaporates without generating impurity gases such as $H_2O$, $H_2$, $O_2$, CO, $CO_2$ and $N_2$ during formation of a protective film on an FPD by electron beam vapor deposition or ion plating and so forth, high-speed and stable film formation is possible, the fineness of the film is improved, and a uniform film can be formed having stable characteristics.

Moreover, the present invention provides a production method of a vapor deposition material for an FPD protective film comprising a step in which one type or two or more types of polycrystalline body, sintered body, or single crystal selected from MgO, CaO, SrO, BaO, alkaline earth composite oxides, rare earth oxides, and composite oxides of alkaline earth oxides and rare earth oxides is formed, and a step in which a fluoride layer is formed on the surface of the above polycrystalline body, sintered body, or single crystal by surface treatment of the above polycrystalline body, sintered body, or single crystal with a fluoridation agent.

Consequently, a vapor deposition material may be obtained comparatively easily that hardly reacts at all with $CO_2$ gas and $H_2O$ gas in the atmosphere even if exposed to the atmosphere for a long period of time.

In addition, one type or two or more types of fluoridation agents may be selected from fluorine gas, hydrogen fluoride gas, $BF_3$, $SbF_4$ and $SF_4$.

Consequently, a fluoride layer may be formed comparatively easily on the surface of a polycrystalline body, sintered body, or single crystal.

In addition, an FPD may be formed using this protective film by forming a protective film using the above vapor deposition material for an FPD protective film, or a vapor deposition material obtained from the above production method of a vapor deposition material for an FPD protective film.

Consequently, FPD may be produced inexpensively as a result of being able to significantly reduce the number of FPD production steps.

Moreover, the present invention provides an FPD protective film equipped with a film body formed from one type of two or more types of oxides selected from MgO, CaO, SrO, BaO, alkaline earth composite oxides, rare earth oxides, and composite oxides of alkaline earth oxides and rare earth oxides on the surface of a substrate, and a fluoride layer formed on the surface of the above film body, wherein the above film body is an aggregate of a plurality of columnar crystallites densely standing on the surface of the above substrate, and the above fluoride layer is respectively formed on the peripheral side surfaces and apices of the above plurality of columnar crystallites.

Consequently, since a plurality of columnar crystallites that compose a film body are each covered with a fluoride film, even if a protective film composed of this film body and fluoride film is exposed to the atmosphere for a long period of time in the FPD production process, the MgO and so forth in the film body hardly reacts at all with $CO_2$ gas and $H_2O$ gas in the atmosphere. As a result, since there is hardly any decomposition of MgO and so forth in the film body into $MgCO_3$, $Mg(OH)_2$ or other substances for which there is the risk of impairing the function of the FPD, the environmental resistance of the film body is improved. In addition, since the film body of the protective film that has a coefficient of thermal expansion which is approximately equal to that of the substrate is adhered to the substrate, the protective film does not peel from the substrate due to thermal cycling, and the adhesion and conformity of the protective film to the substrate are extremely satisfactory.

In addition, the above fluoride layer may be $MO_XF_Y$ (wherein, M is selected from one type of two or more types of Mg, Ca, Sr, Ba, alkaline earth compound metal, rare earth metal and a compound metal of an alkaline earth metal and rare earth metal, and $0 \leq X < 2$ and $0 < Y \leq 4$).

In addition, the above fluoride layer may be formed from a reaction between a fluoridation agent and one type or two or more types of oxides selected from MgO, CaO, SrO, BaO, alkaline earth composite oxides, rare earth oxides, and composite oxides of alkaline earth oxides and rare earth oxides.

In addition, the above fluoridation agent may be one type or two or more types selected from fluorine gas, hydrogen fluoride gas, $BF_3$, $SbF_4$ and $SF_4$.

Consequently, since MgO and so forth in the film body does not decompose into $MgCO_3$, $Mg(OH)_2$ or other substances harmful to the function of the FPD, the amount of time for degassing exhaust treatment that has conventionally been carried out to remove the $MgCO_3$, $Mg(OH)_2$ or other harmful substances in a later step can be shortened, or the gas treatment step can be omitted, thereby making it possible to reduce FPD production costs.

In addition, the ratio (y/x) of the thickness of the above fluoride layer (y) to the diameter of the above columnar crystallites (x) may be from 0.001 to 0.2.

Here, the "diameter of columnar crystallites" refers to diameter "x" in the case the cross-section of columnar crystallites 14a is circular as shown in FIG. 9, or length "x" from the apex to the opposite side in the case the cross-section of columnar crystallites 14a is triangular as shown in FIG. 10. In addition, "columnar" is not limited to that having a circular or triangular shape as mentioned above, but rather includes that having a polygonal shape such as a quadrangle, pentagon or hexagon, or that having an elliptical shape.

As a result of employing these, the above effects can be demonstrated more remarkably.

In addition, an FPD may also be produced using the above FPD protective film.

Consequently, since the number of FPD production steps can be reduced considerably, FPD can be produced inexpensively.

Moreover, the present invention provides a manufacturing device for FPD protective film equipped with a film formation means that forms a film body on one side of a substrate, and a layer formation means that forms a fluoride layer on the surface of the above film body; wherein, the above layer formation means has a layer formation chamber that houses a substrate on which the above film body is formed, a gas supply mechanism that forms a fluoride layer on the surface of the above film body by supplying a fluoridation agent towards the above substrate in the above layer formation chamber, and a substrate heating means that heats the above substrate provided in the above layer formation chamber.

Consequently, fluoridation agent is supplied towards the surface of a film body formed on one side of a substrate by a gas supply means simultaneous to heating the substrate. As a result, together with being able to form a fluoride layer on one side of the substrate, reactivity between the other side of the substrate and the outgoing circuits around the film body (ends of the substrate) with the fluoridation agent is suppressed. Namely, since the selective reactivity of the substrate and film body with respect to the fluoridation agent is improved by heating the substrate with a substrate heating means, corrosion of the substrate by the fluoridation agent can be prevented.

In addition, the above film formation means may also have a film formation chamber that houses the above substrate, and a substrate heating means that heats the above substrate in the above film formation chamber.

In addition, the above film body may be formed using one type or two or more types of oxides selected from alkaline earth oxides, rare earth oxides and composite oxides of alkaline earth oxides and rare earth oxides.

In addition, the above film formation means may be composed using any of electron beam vapor deposition, sputtering, ion plating, screen printing, spin coating or spray coating, the above film body is formed on one surface of the above substrate, and the above substrate may be transferred from the above film formation means to the above layer formation means by a substrate transfer means.

Consequently, if a film body is formed on one side of a substrate by a film formation means, and this substrate is transferred to a layer formation means by a substrate transfer means, formation of the film body and fluoride layer can be carried out continuously.

In addition, the above substrate transfer means may be composed so that the above substrate is transferred from the above film formation means to the above layer formation means without being exposed to the atmosphere.

Consequently, decomposition of MgO and so forth in the film body into $MgCO_3$, $Mg(OH)_2$ and other substances harmful to FPD due to reacting with $CO_2$ gas and $H_2O$ gas in the atmosphere can be prevented.

In addition, the above film formation means may bake the above substrate on which the above film body is formed on one surface in the air, and the above layer formation means may form the above fluoride layer on the surface of the film body of this baked substrate.

Consequently, since the substrate is baked in the atmosphere after a film body has been formed on one side of the substrate by a film formation means but before a fluoride layer is formed on the surface of the film body, decomposition of MgO and so forth in the film body into $MgCO_3$, $Mg(OH)_2$ and other substances harmful to FPD due to reacting with $CO_2$ gas and $H_2O$ gas in the atmosphere can be prevented.

Moreover, the present invention provides a manufacturing device for FPD protective film equipped with a film formation means that forms a film body on one side of a substrate, and a layer formation means that forms a fluoride layer on the surface of the above film body; wherein, the above layer formation means has a layer formation chamber that houses a substrate on which the above film body is formed, a treatment dome provided inside the above layer formation chamber that is pressed against one side of the above substrate while maintaining an airtight state, and a gas supply mechanism that forms a fluoride layer on the surface of the above film body by supplying a fluoridation agent inside the above treatment dome.

Consequently, a substrate on which a film body is formed on one side is housed in a layer formation chamber, and a treatment dome is pressed against one side of the substrate. Fluoridation agent is then supplied inside the treatment dome while in this state to form a fluoride film on the surface of the film body. As a result, since fluoridation agent does not make contact with the other side of the substrate or outgoing circuits around the film body, corrosion of the substrate by the fluoridation agent can be prevented.

In addition, the above film body may be formed using one type or two or more types of oxides selected from alkaline earth oxides, rare earth oxides and composite oxides of alkaline earth oxides and rare earth oxides.

In addition, the above film formation means may be composed using any of electron beam vapor deposition, sputtering, ion plating, screen printing, spin coating or spray coating, the above film body is formed on one surface of the above substrate, and the above substrate may be transferred from the above film formation means to the above layer formation means by a substrate transfer means.

Consequently, if a film body is formed on one side of a substrate by a film formation means, and this substrate is transferred to a layer formation means by a substrate transfer means, formation of the film body and fluoride layer can be carried out continuously.

In addition, the above substrate transfer means may be composed so that the above substrate is transferred from the above film formation means to the above layer formation means without being exposed to the atmosphere.

Consequently, decomposition of MgO and so forth in the film body into $MgCO_3$, $Mg(OH)_2$ and other substances harmful to FPD due to reacting with $CO_2$ gas and $H_2O$ gas in the atmosphere can be prevented.

In addition, the above film formation means may bake the above substrate on which the above film body is formed on one surface in the air, and the above layer formation means may form the above fluoride layer on the surface of the film body of this baked substrate.

Consequently, since the substrate is baked in the atmosphere after a film body has been formed on one side of the substrate by a film formation means but before a fluoride layer is formed on the surface of the film body, decomposition of MgO and so forth in the film body into $MgCO_3$, $Mg(OH)_2$ and other substances harmful to FPD due to reacting with $CO_2$ gas and $H_2O$ gas in the atmosphere can be prevented.

DETAILED DESCRIPTION OF THE INVENTION

The following provides an explanation of a first embodiment of the present invention with reference to the drawings.

Figure 11:
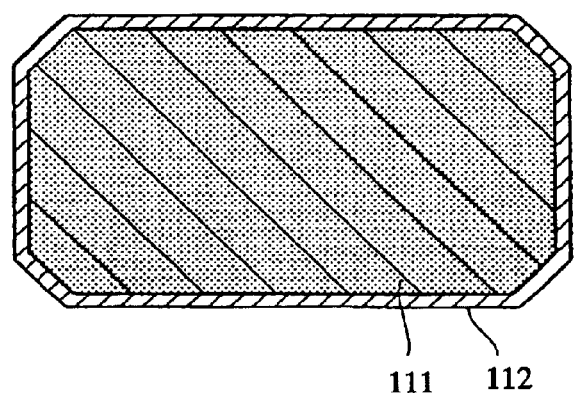
FIG. 11 is a cross-sectional view of the vapor deposited material of the present invention.

As shown in FIG. 11, vapor deposition material 110 for an FPD protective film of the present invention is formed by polycrystalline body 111, the surface of which is covered with fluoride layer 112. Polycrystalline body 111 may be a sintered body or a fine sintered body. Polycrystalline body 111 is formed using one type or two types of powders selected from MgO, CaO, SrO, BaO, alkaline earth composite oxides, rare earth oxides, and composite oxides of alkaline earth oxides and rare earth oxides. Although there are no particular restrictions on the method for obtaining the polycrystalline body 111, a method comprising steps of molding powder of oxides and sintering the molded powder is typically widely known. Although FIG. 11 shows vapor deposition material 110 for a protective film that is formed by polycrystalline body 111 in which the surface is covered with fluoride layer 112, it may also be formed by a single crystal in which the surface is covered with fluoride layer 112. Although there are no particular restrictions on the method for fabricating the single crystal, arc fusing is typically widely known (J. Chem. Phys. 35, p. 3752–3756 (1971)), On the other hand, fluoride layer 112 can be obtained by reacting one type or two or more types of oxides selected from MgO, CaO, SrO, BaO, alkaline earth composite oxides, rare earth oxides and composite oxides of alkaline earth oxides and rare earth oxides, with a gaseous fluoridation agent. Fluorine gas, hydrogen fluoride gas, $BF_3$, $SbF_3$ or $SF_4$ can be used for the gaseous fluoridation agent from the viewpoints of high reactivity and universality, while fluorine gas or hydrogen fluoride gas is used particularly preferably. In addition, the thickness of fluoride layer 112 is determined according to the balance between improving inhibition of reactions between MgO and so forth with $CO_2$ gas and $H_2O$ gas, and the reaction time between MgO and so forth and the fluoridation agent, and is formed preferably within the range of 0.1 nm to 100 μm, and particularly preferably within the range of 1 nm to 1 μm. The reason for limiting the thickness of fluoride layer 112 to within the range of 0.1 nm to 100 μm is that if the thickness exceeds 100 μm, the reaction time between MgO and so forth and gaseous fluoridation agent is prolonged thereby resulting in poor workability.

Next, an explanation is provided of the production method of vapor deposition material 110 for an FPD protective film. This production method of vapor deposition material 110 for an FPD protective film includes a step in which a polycrystalline body 111 is formed using one type or two or more types of powders selected from MgO, CaO, SrO, BaO, alkaline earth composite oxides, rare earth oxides and composite oxides of alkaline earth oxides and rare earth oxides, and a step in which fluoride layer 112 is formed on the surface of this polycrystalline body 111 by surface treatment of that polycrystalline body 111 with a gaseous fluoridation agent.

[1] Polycrystalline Body Formation

In the step of forming polycrystalline body 111, a prescribed amount of one type or two or more types of a powder selected from MgO, CaO, SrO, BaO, alkaline earth composite oxides, rare earth oxides and composite oxides of alkaline earth oxides and rare earth oxides is first prepared. It is preferable that the mean particle size of this prepared powder be within the range of 0.01–100 μm. If the mean particle size of the powder is less than 0.01 μm, the powder coagulates as a result of being too fine thereby worsening powder handling and making it difficult to prepare a highly concentrated slurry. If the mean particle size exceeds 100 μm, it becomes difficult to control the hyperfine structure and prevents the obtaining of a fine polycrystalline body 111. In addition, if the mean particle size of MgO or other powder is limited to the above range, there is the advantage of the desired polycrystalline body 111 being able to be obtained without having to use a sintering assistant.

Next, a slurry is prepared by mixing any of the powders with a binder and organic solvent. It is preferable that the concentration of the slurry at this time be 40–70% by weight. If the concentration exceeds 70% by weight, stable granulation becomes difficult since the above slurry is a non-aqueous system. If the concentration is less than 40% by weight, a fine polycrystalline body 111 having a uniform structure is unable to be obtained. Namely, if the slurry concentration is limited to the above preferable range, the slurry viscosity is 200 cps or less, and stable granulation of powder can be carried out using, for example, a spray dryer. Moreover, a fine powdered body 111 can be produced in which the compact of fluoride layer 112 has high density.

In addition, wet mixing of powder, binder and organic solvent, and particularly wet mixing of powder and organic solvent in the form of a dispersing medium, is carried out using a wet ball mill or agitating mill. In the case of a wet ball mill, mixing is performed for 8–24 hours, and preferably 20–24 hours, using a large number of $ZrO_2$ balls having a diameter of 5–10 mm in the case of using $ZrO_2$ balls. The reason for limiting the diameter of the $ZrO_2$ balls to 5–10 mm is that, if the diameter is less than 5 mm, mixing becomes inadequate, and if the diameter exceeds 10 mm, there is an increased level of impurities. In addition, the reason for the mixing time being long at a maximum of 24 hours is that there is little generation of impurities even if mixing is performed continuously for a long period of time. On the other hand, in the case of using iron-core plastic balls in a wet ball mill, it is preferable to use balls having a diameter of 10–15 mm.

In the case of an agitating mill, wet mixing is carried out for 0.5–1 hour using $ZrO_2$ balls having a diameter of 1–3 mm. The reason for limiting the diameter of the $ZrO_2$ balls to 1–3 mm is that if the diameter is less than 1 mm, mixing is inadequate, while if the diameter exceeds 3 mm, there is the problem of increased levels of impurities. In addition, the reason for the short mixing time of a maximum of 1 hour is that if the mixing time exceeds 1 hour, the mill serves to not only mix the raw materials but grind them as well, thereby causing the generation of impurities. Moreover, the raw materials can be adequately mixed with a mixing time of 1 hour.

Next, after spray drying the above slurry to obtain a granulated powder having a mean particle size of 50–300 $\mu$m and preferably 50–200 $\mu$m, the granulated powder is placed in the prescribed mold and molded at the prescribed pressure. Here, the reason for limiting the mean particle size of the granulated powder is that if the mean particle size is less than 50 $\mu$m, there is the problem of poor moldability, and if the mean particle size exceeds 300 $\mu$m, there is the problem of the compact density and strength of fluoride layer 112 becoming excessively low. The above spray drying is preferably carried out using a spray dryer. In addition, molding of sintered body pellets 111 is preferably carried out using a mechanical press, tablet machine, briquette machine or any other mold pressing method.

Figure 12A:
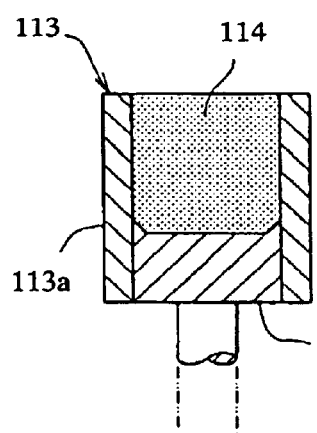
FIGS. 12A to 12C are process drawings in which a polycrystalline body is formed by mechanical pressing.
Figure 12B:
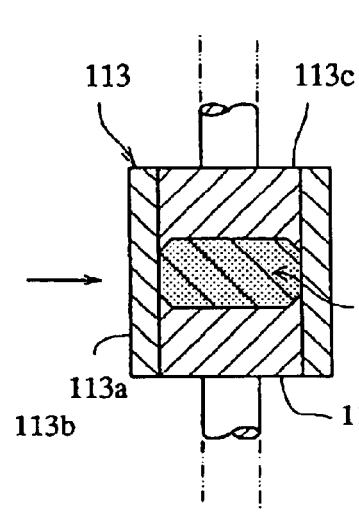
Figure 12C:
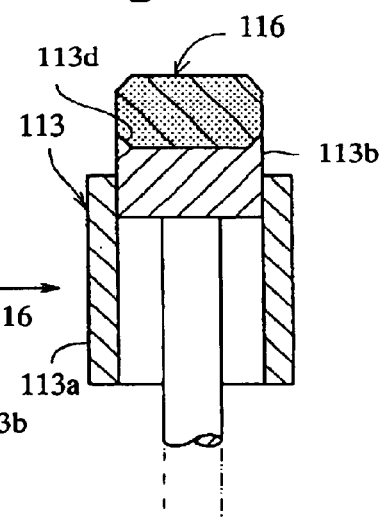

FIGS. 12A through 12C show an example of a mechanical press apparatus 113 that is used for mechanical pressing. This apparatus 113 is equipped with cylindrical dye 113a, lower punch 113b inserted from the bottom of this dye 113a, and upper punch 113c inserted from the top of dye 113a In order to mold granulated powder 114 with this apparatus 113, granulated powder 114 is first loaded into the cylindrical dye 113a with cylindrical lower punch 113b inserted from the bottom into the above cylindrical dye 113a (FIG. 12A), and upper punch 113c is inserted from the top into dye 113a to tightly press granulated powder 114 (FIG. 12B). Next, after taking out upper punch 113c, compact 116 in the shape of sintered body pellet 111 is pushed up by lower punch 113b and this compact 116 is removed (FIG. 12C). In addition, the pressing pressure of the above mechanical press is 300–2000 kg/cm$^2$, and preferably 500–1000 kg/cm$^2$. The reason for limiting the pressing pressure to the above range is that if the pressure is less than 300 kg/cm$^2$, the prescribed density is not obtained, while if the pressure exceeds 2000 kg/cm$^2$, lamination occurs that can cause cracking and chipping. In addition, if a high-pressure press is used, a high-strength mold is required and the molding apparatus becomes larger. Consequently, molding costs rise making this undesirable. Since a binder is mixed into this raw material powder, a compact 116 can be obtained having adequately high strength and large density even with a comparatively low pressure.

Moreover, compact 116 in the form of sintered body pellet 111 is sintered at a prescribed temperature. It is preferable to degrease compact 116 at a temperature of 350–620° C. prior to sintering. This degreasing is carried out to prevent color unevenness after sintering compact 116, and is preferably carried out for a sufficient amount of time. It is preferable that sintering be carried out at a temperature of 1500–1700° C. The reason for limiting the sintering temperature to 1500–1700° C. is that if sintering is carried out below 1500° C., a fine sintered body is not obtained, and if sintering is carried out above 1700° C., particle growth becomes remarkably fast resulting in a decrease in characteristics. In addition, in the case of sintering the compact in an atmosphere containing an inert gas, argon gas is preferably used for the inert gas. A fine polycrystalline body 111 is obtained in this manner having a relative density of 95% or more.

[2] Fluoride Layer Formation

Next, fluoride layer 112 is formed on the surface of polycrystalline body 111 obtained in the manner described above. Formation of this fluoride layer 112 is carried out by holding this polycrystalline body 111 in an atmosphere containing a gaseous fluoridation agent (temperature: 10–100° C.) for 0.1–120 minutes to modify the surface of polycrystalline body 111 and form fluoride layer 112 on the surface of polycrystalline body 111. Examples of gaseous fluoridation agents include fluorine gas, hydrogen fluoride gas, $BF_3$, $SbF_3$ and $SF_4$, while fluorine gas and hydrogen fluoride gas are used particularly preferably. The pressure of this gaseous fluoridation agent is preferably set to be within the range of 1–760 Torr, and more preferably, 10–300 Torr. The reason for limiting the pressure of the gaseous fluoridation agent to within 1–760 Torr is to facilitate control of the progress of the reaction, namely the thickness of fluoride layer 112.

Formation of fluoride layer 112 is preferably carried out by forming polycrystalline body 111 in a vacuum or inert gas, and surface treating this polycrystalline body 111 with gaseous fluoridation agent without exposing to the atmosphere. However, in the case polycrystalline body 111 is exposed to the atmosphere, fluoride layer 112 is preferably a formed on the surface of polycrystalline body 111 by sintering that polycrystalline body 111 in air to activate polycrystalline body 111 followed by surface treatment with gaseous fluoridation agent. The sintering temperature in air of polycrystalline body 111 in this case is 250–550° C., and preferably 350–450° C., and the sintering time is 0.1–24 hours, and preferably 0.2–1 hour. Polycrystalline body 111 is activated by sintering at a temperature and time within the above ranges. As a result of performing this treatment, polycrystalline body 111 is activated by sintering polycrystalline body 111 in air even if carbonates (e.g., $MgCO_3$) or hydroxides (e.g., $Mg(OH)_2$) of MgO and so forth, which are harmful to FPD, are formed on the surface of polycrystalline body 111, and carbonates (e.g., $MgCO_3$) or hydroxides (e.g., Mg(OH)$_2$) of MgO and so forth on the surface of polycrystalline body 111 are removed in the form of CO$_2$ and H$_2$O. By forming fluoride layer 112 on the surface of polycrystalline body 111 in this state, the surface of polycrystalline body 111 is protected by fluoride layer 112, enabling the formation of carbonates (e.g., MgCO$_3$) or hydroxides (e.g., Mg(OH)$_2$) of MgO and so forth to be prevented or inhibited.

In vapor deposition material 110 for an FPD protective film manufactured in this manner, since the surface of polycrystalline body 111 is covered with fluoride layer 112, polycrystalline body 111 hardly reacts at all with CO$_2$ gas or H$_2$O gas in the atmosphere even if vapor deposition material 110 is exposed to the atmosphere for a long period of time. As a result, the duration of the degassing exhaust treatment performed after placing this vapor deposition material 110 in a vacuum deposition container can be shortened to a duration shorter than that of the prior art, thereby making it possible to reduce FPD production cost. In addition, since the surface of polycrystalline body 111 does not deteriorate in the case of this vapor deposition material 110, vapor deposition material 110 can be vapor deposition without the generation of impurity gases such as H$_2$O, H$_2$, O$_2$, CO, CO$_2$ and N$_2$ when forming a protective film on an FPD by electron beam deposition, ion plating and so forth. Consequently, a stable film can be produced at high speed and the fineness of the film is improved. In addition, when a substrate formed using the above vapor deposition material 110 is incorporated in a PDP, resistance to sputtering during discharge can be improved. Thus, the above protective film is suitable for the formation of protective films of AC PDP, and can also be applied to the protective films of highly functional ceramic materials.

Next, an explanation is provided of a second embodiment of the present invention with reference to the drawings.

Although examples of the FPD of the present invention include PDP and PALC, an explanation is provided with respect to a PDP in this embodiment.

Figure 7:
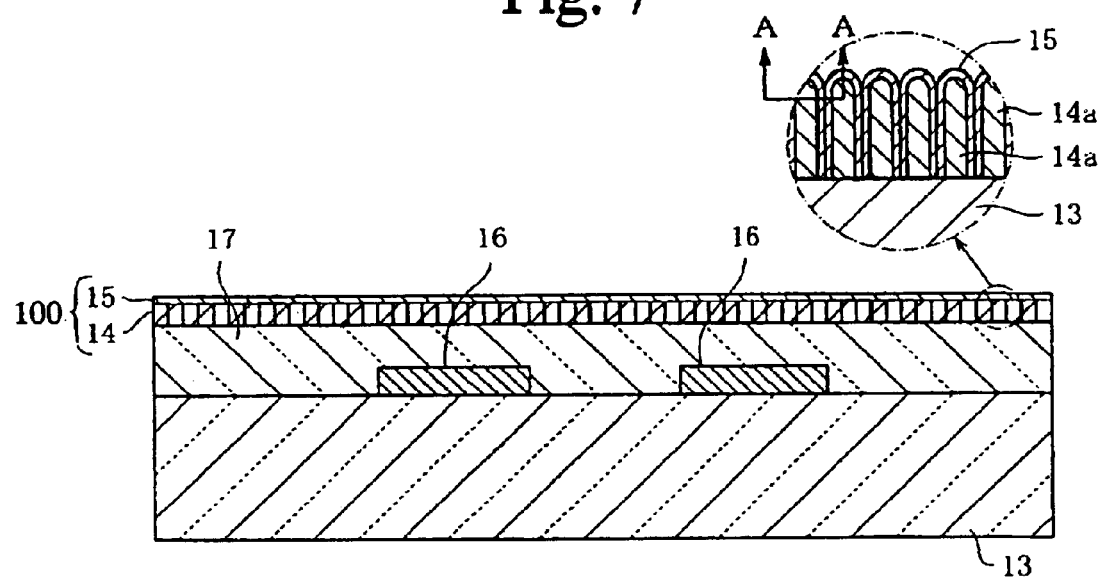
FIG. 7 is a cross-sectional view of a front substrate on which the protective film of the present invention is formed.
Figure 8:
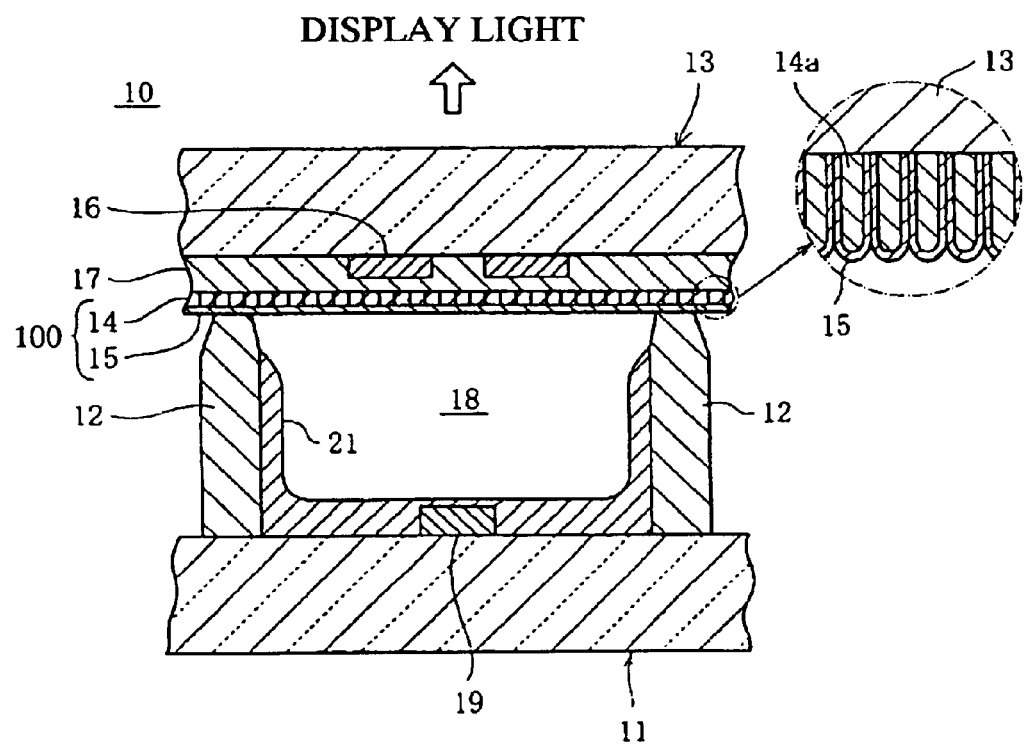
FIG. 8 is a cross-sectional view of the essential portion of a PDP in which the formed front substrate is incorporated.

As shown in FIGS. 7 and 8, AC PDP 10 is composed by placing front glass substrate 13 over back glass substrate 11 with partitions 12 formed at prescribed intervals in between. Film body 14 is formed on the side of front glass substrate 13 that opposes back glass substrate 11 with display electrodes 16 and transparent dielectric layer 17 between front glass substrate 13 and film body 14, and fluoride layer 15 is formed on the surface of this film body 14. As shown in the enlarged view of the drawing, film body 14 constitutes an aggregate of a plurality of columnar crystallites 14$a$ densely standing in a fine pattern on the surface of front glass substrate 13, and fluoride layer 15 is respectively formed on the peripheral side surfaces and apices of the above plurality of columnar crystallites 14$a$. A large number of discharge cells 18 are partitioned and formed by back glass substrate 11, front glass substrate 13 and partitions 12, and address electrode 19 is formed on back glass substrate 11 so as to be positioned within discharge cell 18 and in opposition to the above display electrodes 16. In addition, phosphor layer 21 is formed within discharge cell 18 extending from the sides of partitions 12 to the upper surface of back glass substrate 11. Moreover, a discharge gas (not shown) is injected into discharge cells 18.

The above fluoride layer 15 is composed of MO$_x$F$_y$ (wherein, M is Mg, Ca, Sr, Ba, alkaline earth compound metal, rare earth metal or a compound metal of an alkaline earth metal and rare earth metal, and $0 \leq X < 2$ and $0 < Y \leq 4$), examples of which include an MF$_2$ layer, MO$_{0.5}$F layer, MO$_{0.25}$F$_{1.5}$ layer, MF$_4$ layer, MOF$_2$ layer, MF$_3$ layer, MOF layer, MF$_{2.66}$ layer and MOF$_{0.66}$ layer. In addition, fluoride layer 15 can be obtained by reacting one type or two or more types of oxides selected from MgO, CaO, SrO, BaO, alkaline earth composite oxides, rare earth oxides, and composite oxides of alkaline earth oxides and rare earth oxides, with a gaseous fluoridation agent, examples of fluoridation agents including, from the viewpoint of high reactivity and universality, fluorine gas, hydrogen fluoride gas, BF$_3$, SbF$_4$ and SF$_4$, with fluorine gas and hydrogen fluoride gas used particularly preferably.

Figure 9:
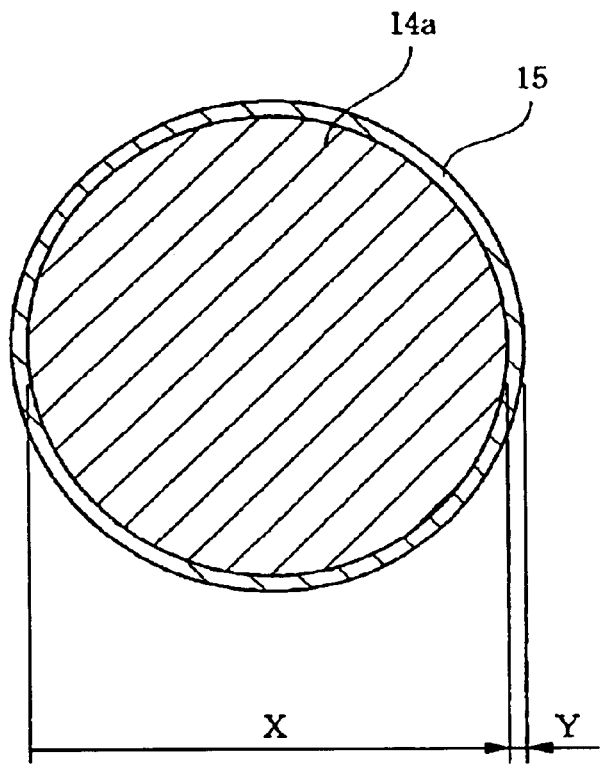
FIG. 9 is a cross-sectional view taken along line A—A of FIG. 7 showing a columnar crystallite having a circular cross-section that composes a protective film.
Figure 10:
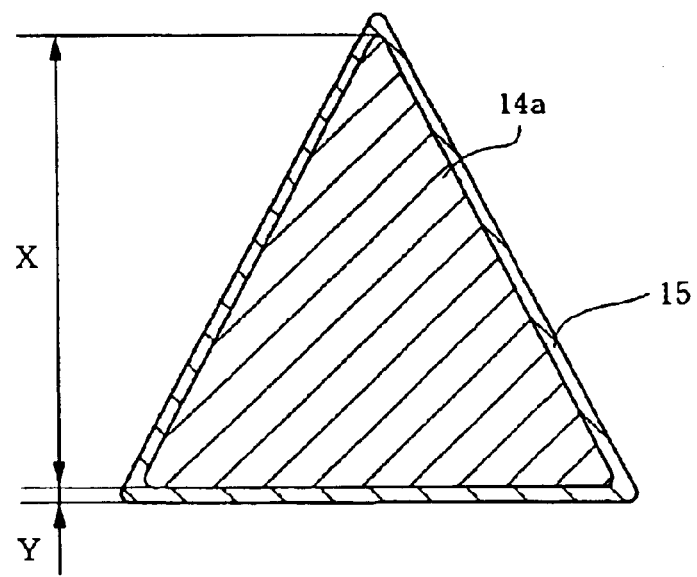
FIG. 10 is a cross-sectional view corresponding to FIG. 9 showing the horizontal cross-section of a columnar crystallite having a triangular cross-section.

In addition, as shown in FIGS. 9 and 10, the ratio (y/x) of the thickness of the fluoride layer 15 (y) to the diameter of the columnar crystallites 14$a$ (x) is determined according to the balance between improving inhibition of the reaction between MgO and so forth with CO$_2$ gas or H$_2$O gas, and the reaction time between MgO and so forth and the gaseous fluoridation agent. This ratio is preferably from 0.001 to 0.2, and more preferably from 0.005 to 0.1. The reason for making the ratio (y/x) of the thickness of fluoride layer 15 (y) to the diameter of columnar crystallites 14$a$ (x) from 0.001 to 0.2 is that, if the ratio is less than 0.001, there is the risk of fluoride layer 15 being unable to adequately protect film body 14 in the form of an aggregate of a plurality of columnar crystallites 14$a$, while if the ratio exceeds 0.2, the reaction time between MgO and so forth and the gaseous fluoridation agent becomes excessively long, thereby resulting in poor workability.

In the case of depositing film body 14 using a vacuum process, when film body 14 is deposited on the surface of glass substrate 13 by, for example, electron beam vapor deposition, sputtering or ion plating and so forth, a plurality of columnar crystallites 14$a$ are densely provided standing on the surface of that substrate 13, and a film body 14 in the form of an aggregate of a plurality of columnar crystallites 14$a$ is known to be formed (for example, H. Seehase: "Plasma display panel MgO thin film properties and their modification by low energy ion bombardment", Display, [1], pp. 21–34 (1985); T. Kamimiya: "Cathode materials for color plasma displays", 0plusE, [2], pp. 90–96 (1996)). On the basis of this finding, a PDP protective film having the above composition requires the use of a vacuum process, and the following provides an explanation of an example of a production method for an FPD protective film using vapor deposition and sputtering.

[3] Formation of Film Body by Vapor Deposition

To begin with, as shown in FIG. 7, after coating, drying and baking an electrode paste consisting of Au or Ag to serve as display electrodes 16 at prescribed intervals on the surface of front glass substrate 13 by screen printing, a transparent glass paste to serve as transparent dielectric layer 17 on the surface of the above front glass substrate 13 is coated and dried on the entire surface of the above glass substrate 13 by screen printing. After holding the above front glass substrate 13 in air at a temperature of 100–200° C. for 10–60 minutes and drying, it is baked in air by holding at a temperature of 500–600° for 10–60 minutes.

Next, one type or two or more types of sintered body pellets selected from MgO, CaO, SrO, BaO, alkaline earth composite oxides, rare earth oxides, and composite oxides of alkaline earth oxides and rare earth oxides having a purity of 99.5% or more are deposited so as to cover the surface of transparent dielectric layer 17 of the above glass substrate 13 by electron beam vapor deposition or other vapor deposition method to form film body 14 comprised of an aggregate of a plurality of densely standing columnar crystallites 14$a$. Preferable conditions for depositing this film body 14 consist of an acceleration voltage of 5–30 kV, vapor deposition pressure of $0.1 \times 10^{-2}$ to $10 \times 10^{-2}$ Pa and vapor deposition distance within the range of 100–1000 mm.

Moreover, the peripheral side surfaces and apices of the plurality of columnar crystallites 14a that compose film body 14 are modified by holding this front glass substrate 13 in a gaseous fluoridation agent atmosphere for 0.1–120 minutes (at 10–100° C.) to form fluoride layer 15 on the peripheral side surfaces and apices of this plurality of columnar crystallites 14a. Examples of the above gaseous fluoridation agent include fluorine gas, hydrogen fluoride gas, $BF_3$, $SbF_3$ and $SF_4$, while fluorine gas or hydrogen fluoride gas is used particularly preferably. The pressure of this gaseous fluoridation agent is preferably set within the range of 1–760 Torr, and more preferably within the range of 10–300 Torr. The reason for limiting the pressure of the gaseous fluoridation agent to 1–760 Torr is that to facilitate control of the progress of the reaction, namely the thickness of the fluoride layer.

[4] Formation of Film Body by Sputtering

To begin with, after fabricating a glass substrate with electrodes in the same manner as section [3] above, film body 14 in the form of an aggregate of a plurality of finely standing columnar crystallites 14a is form on a glass substrate so as to cover the surface of a transparent dielectric layer by sputtering using one type or two or more types of 5-inch targets selected from MgO, CaO, SrO, BaO, alkaline earth composite oxides, rare earth oxides, and composite oxides of alkaline earth oxides and rare earth oxides having a purity of 99.5% or more. Preferable conditions for depositing this film body 14 consist of a high-frequency output of 1 kW, sputtering pressure of 0.50–3.0 Pa, oxygen concentration relative to the argon gas of 5–50%, and substrate temperature within the range of 20–300° C.

Next, the peripheral side surfaces and apices of the plurality of columnar crystallites 14a that compose film body 14 are modified by holding the substrate in a gaseous fluoridation agent atmosphere in the same manner as section [3] above to form fluoride layer 15 on the peripheral side surfaces and apices of this plurality of columnar crystallites 14a.

In the case of a PDP protective film produced as described in sections [3] and [4] above, fluoride layer 15 is respectively formed on the peripheral side surfaces and apices of a plurality of columnar crystallites 14a that compose film body 14, and film body 14 in the form of an aggregate of the plurality of columnar crystallites 14a is covered by fluoride layer 15. Consequently, in the production process of PDP 10, even if protective film 100 comprised of film body 14 and fluoride layer 15 is exposed to the atmosphere for a long period of time, the MgO and so forth in film body 14 hardly reacts at all with $CO_2$ gas and $H_2O$ gas in the atmosphere. As a result, since there is hardly any deterioration of MgO and so forth in film body 14 into substances such as $MgCO_3$ or $Mg(OH)_2$ for which there is the risk of impairing the function of PDP 10, the environmental resistance of film body 14 can be improved.

In addition, since hardly any of the MgO and so forth in film body 14 deteriorates into substances such as $MgCO_3$ or $Mg(OH)_2$, the duration of degassing exhaust treatment for removing the above $MgCO_3$ or $Mg(OH)_2$ and so forth in a later step can be shortened or the degassing exhaust treatment step can be omitted, thereby making it possible to reduce the production cost of PDP 10. Moreover, since film body 14 having roughly the same coefficient of thermal expansion as dielectric layer 17 of protective film 100 is adhered to transparent dielectric layer 17, protective film 100 is not separated from transparent dielectric layer 17 due to thermal cycling, and the adherence and compatibility of protective film 100 to transparent dielectric layer 17 are extremely satisfactory.

Furthermore, the formation process of protective film 100 in the above sections [3] and [4] is preferably carried out using treatment like that described in [a]or [b] below.

[a]Film body 14 is formed in a vacuum on the surface of glass substrate 13, the peripheral side surfaces and apices of a plurality of columnar crystallites that compose film body 14 are modified with a gaseous fluoridation agent in a vacuum or inert gas atmosphere without exposing this film body 14 to the atmosphere, fluoride layer 15 is formed on the peripheral side surfaces and apices of this plurality of columnar crystallites 14a, and film body 14 composed of the plurality of columnar crystallites is protected with fluoride layer 15. The above inert gas atmosphere preferably refers to an atmosphere of argon gas or $N_2$ gas, and preferably the purity is 4 N (99.99%) or more, the dew point is −65° C. or lower, and the concentrations of $CO_2$ and CO are 5.0 volume ppm or less. By performing this treatment, since film body 14 is not exposed to the atmosphere after forming film body 14 on the surface of substrate 13 but before forming fluoride layer 15 on the peripheral side surfaces and apices of the plurality of columnar crystallites that compose film body 14, the formation of carbonates (e.g., $MgCO_3$) or hydroxides (e.g., $Mg(OH)_2$) of MgO and so forth that are harmful to FPD on the surface of film body 14 can be prevented or inhibited.

[b] Film body 14 is formed in a vacuum on the surface of substrate 13, film body 14 is baked in air after exposing it to the atmosphere, the peripheral side surfaces and apices of a plurality of columnar crystallites 14a that compose film 14 are activated, and fluoride layer 15 is formed on the peripheral side surfaces and apices of the plurality of columnar crystallites 14a by additional surface treatment with a gaseous fluoridation agent. The baking temperature in air of the above film body 14 is 250–550° C. and preferably 350–450° C., and the baking time is 0.1–24 hours and preferably 0.2–1 hour. The peripheral side surfaces and apices of the plurality of columnar crystallites 14a that compose film body 14 are activated by baking at a temperature and time within the above ranges. In addition, the above atmosphere refers to an atmospheric pressure of 0.1 atm ≤ Pt ≤ 5.0 atm (and preferably 1.0 atm), and the content ratios $V_{N2}$, $V_{O2}$, $V_{H2O}$ and $V_{COZ}$ of $N_2$, $O_2$, $H_2O$ and $CO_Z$, respectively, in the atmosphere refer to those indicated below:

65 vol % ≤ $V_{N2}$ ≤ 5.0 vol % (preferably 78.1 vol %)

10 vol % ≤ $V_{O2}$ ≤ 30 vol % (preferably 21.0 vol %)

0 vol % ≤ $V_{H2O}$ ≤ 5 vol % (preferably 2.5 vol %)

0 vol % ≤ $V_{COZ}$ ≤ 0.1 vol % (preferably 0.03 vol %)

wherein, Z is either 1 or 2. In addition, this atmosphere contains other impurity gases (such as hydrocarbons) at 0.1 vol % or less.

By carrying out this treatment, even if carbonates (e.g., $MgCO_3$) or hydroxides (e.g., $Mg(OH)_2$) of MgO and so forth, which are harmful to FPD, are formed on the peripheral side surfaces and apices of a plurality of columnar crystallites 14a that compose film body 14 when this film body 14 is exposed to the atmosphere after baking film body 14 on the surface of substrate 13, as a result of baking film body 14 in air, the peripheral side surfaces and apices of the plurality of columnar crystallites 14a that compose film body 14 are activated, and the carbonates (e.g., $MgCO_3$) or hydroxides (e.g., $Mg(OH)_2$) of MgO and so forth on the surface of film body 14 are removed in the form of $CO_2$ and $H_2O$. By forming fluoride layer 15 on the peripheral side surfaces and apices of the plurality of columnar crystallites 14a that compose film body 14 in this state, film body 14 in the form of an aggregate of the plurality of columnar crystallites 14a is protected by fluoride layer 15, thereby making it possible to prevent or inhibit the formation of carbonates (e.g., $MgCO_3$) or hydroxides (e.g., $Mg(OH)_2$) of MgO and so forth.

Furthermore, it is preferable to activate film body 14 by baking in air in the above [a]and [b] either before, during or after assembly of substrate 13 on which film body 14 and fluoride layer 15 have been formed on the surface thereof. The baking temperature and atmosphere of the baking in air are the same as in the case of [b] above. Since film body 14 is activated by performing this baking, even if slight amounts of hydroxides such as $Mg(OH)_2$ of MgO and so forth are formed on film body 14, they can be removed as $H_2O$, thereby making it possible to lower the following recontamination rate of film body 14 caused by moisture in the atmosphere.

Furthermore, although PDP is described as an example of an FPD in the above embodiment, the FPD may be, for example, a PALC provided a film body is formed as a protective film on the surface of a front glass substrate.

Next, an explanation is provided of a third embodiment of the present invention with reference to the drawings.

Although examples of FPD include PDP and PALC, the example of a PDP is explained in the present embodiment.

Figure 2:
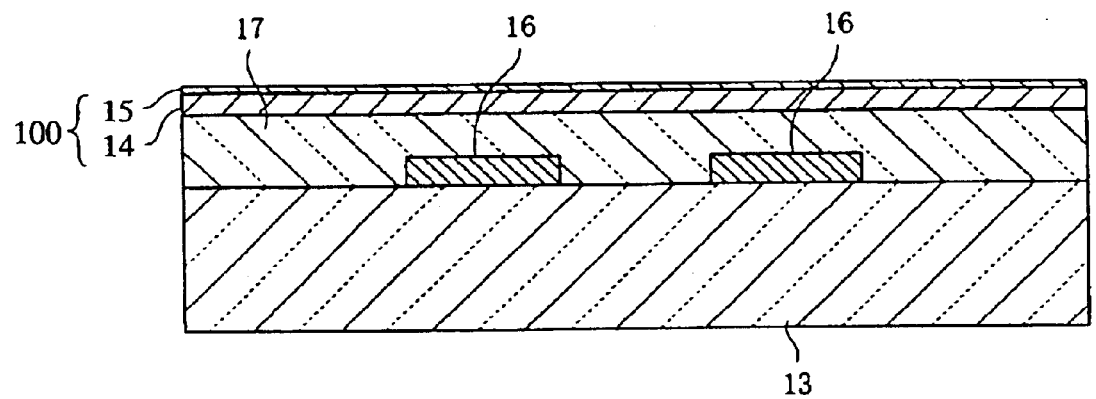
FIG. 2 is a cross-sectional view of a front glass substrate on which the protective film is formed.
Figure 3:
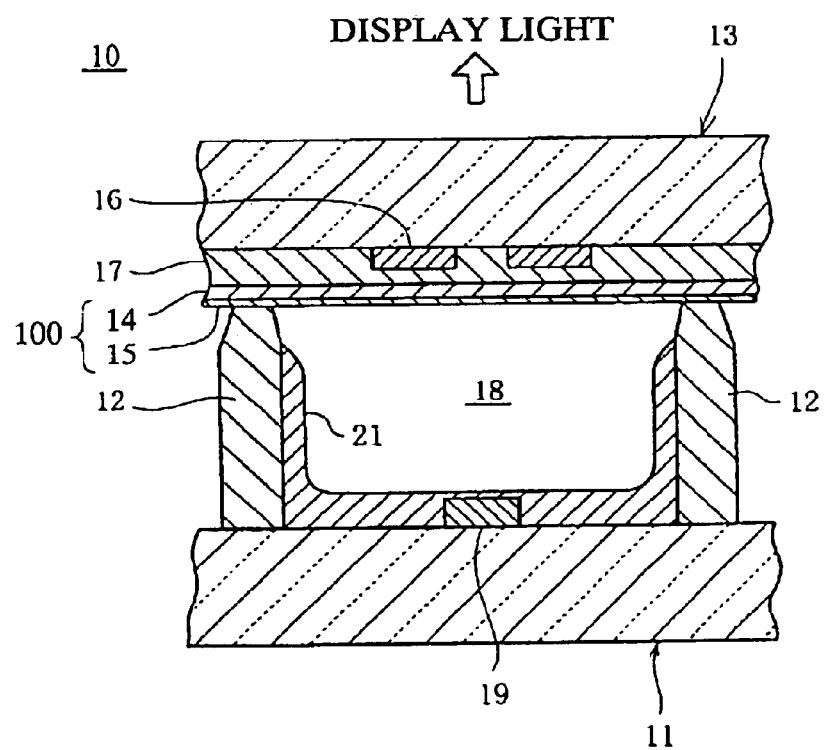
FIG. 3 is a cross-sectional view of the essential portion of a PDP in which the front glass substrate is incorporated.

As shown in FIGS. 2 and 3, AC PDP 10 is composed by placing rectangular front glass substrate 13 over rectangular back glass substrate 11 with partitions 12 formed at prescribed intervals in between. Film body 14 is formed on the side of front glass substrate 13 that opposes back glass substrate 11 with display electrodes 16 and transparent dielectric layer 17 between front glass substrate 13 and film body 14, and fluoride layer 15 is formed on the surface of this film body 14. Protective film is composed by the above film body 14 and fluoride layer 15. In addition, outgoing circuits (not shown) are formed around the periphery of film body 14 of protective film 100. A large number of discharge cells 18 are partitioned and formed by back glass substrate 11, front glass substrate 13 and partitions 12, and address electrode 19 is formed on back glass substrate 11 so as to be positioned within discharge cell 18 and in opposition to the above display electrodes 16. In addition, phosphor layer 21 is formed within discharge cell 18 extending from the sides of partitions 12 to the upper surface of back glass substrate 11. Moreover, a discharge gas (not shown) is injected into discharge cells 18.

The above fluoride layer 15 is composed of $MO_xF_y$ (wherein, M is an alkaline earth C3 metal, rare earth metal or a compound metal thereof, and $0 \leq X < 2$ and $0 < Y \leq 4$), examples of which include an $MF_2$ layer, $MO_{0.5}F$ layer, $MO_{0.25}F_{1.5}$ layer, $MF_4$ layer, $MOF_2$ layer, $MF_3$ layer, $MOF$ layer, $MF_{2.66}$ layer and $MOF_{0.66}$ layer. Examples of the above alkaline earth metals include Mg, Ca, Sr, Ba or compound metals of these alkaline earth metals (e.g., a Mg—Ca and Ca—Sr), examples of the above rare earth metals include Sc, Y, La, Ce, Dy, Gd and Yb, and examples of the above compound metals of alkaline earth metals and rare earth metals include Mg—Gd, Mg—Y and Mg—La. In addition, fluoride layer 15 can be obtained by reacting an alkaline earth oxide, rare earth oxide or compound oxide thereof that forms film body 14 with a gaseous fluoridation agent, examples of fluoridation agents including, from the viewpoint of high reactivity and universality, fluorine gas, hydrogen fluoride gas, $BF_3$, $SbF_4$ and $SF_4$, with fluorine gas and hydrogen fluoride gas used particularly preferably. Furthermore, examples of the above alkaline earth oxides include MgO, CaO, SrO, BaO and composite oxides of these alkaline earth metals (e.g., MgCaO and CaSrO), examples of the above rare earth oxides include $Sc_2O_3$, $Y_2O_3$, $La_2O_3$, $CeO_2$, $Dy_2O_3$, $Gd_2O_3$ and $Yb_2O_3$, and examples of the above composite oxides of the above alkaline earth oxides and rare earth oxides include $MgGd_2O_4$, $MgY_2O_4$ and $MgLa_2O_4$.

Figure 1:
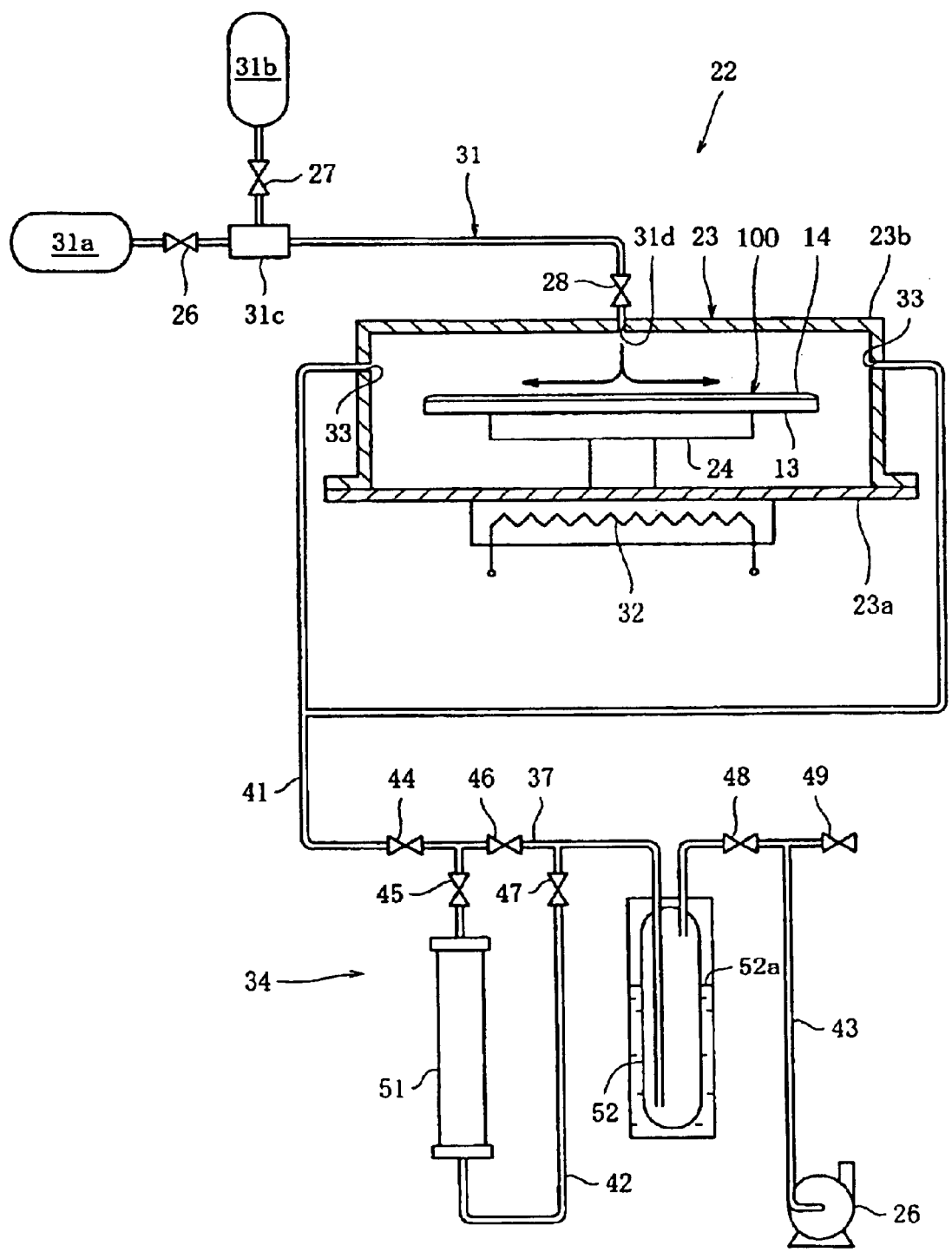
FIG. 1 is a cross-sectional block diagram showing a manufacturing device for FPD protective film of the present invention.

As shown in FIG. 1, the manufacturing device for protective film 100 of the present invention is equipped with layer formation means 22 that forms fluoride layer 15 on the surface of film body 14 formed on front glass substrate 13. This layer formation means 22 has layer formation chamber 23, which houses front glass substrate 13, gas supply mechanism 31 that supplies a gaseous fluoridation agent towards substrate 13 inside this chamber 23 to form fluoride layer 15 on the surface of film body 14, and substrate heating means 32 provided in chamber 23 that and heats glass substrate 13.

Layer formation chamber 23 is composed of base 23a, on which substrate holder 24 stands on the upper surface in the center, and cover 23b formed in the shape of a bowl, the lower peripheral edge of which adheres to the outer peripheral edge of base 23a. This chamber 23 is composed so that the inside is open to the atmosphere either by lowering base 23a or raising cover 23b. Substrate 13 is placed on the upper surface of substrate holder 24 with the one side on which film body 14 is formed facing upward. Furthermore, the above film body 14 is formed on one side of substrate 13 by a film formation means (not shown). Namely, a film formation means is composed so as to form film body 14 on one side of substrate 13 in advance by electron beam vapor deposition, sputtering, ion plating, screen printing, spin coating or spray coating.

Gas supply mechanism 31 has a first tank 31a in which a gaseous fluoridation agent such as hydrogen fluoride gas is stored, a second tank 31b in which an inert gas such as nitrogen gas is stored, a mass flow controller 31c that controls the mass flow volume of a mixed gas of gaseous fluoridation agent and inert gas at a constant level, and a discharge port 31d formed in the center of cover 23b that discharges the above mixed gas into chamber 23. Reference symbols 26, 27 and 28 in FIG. 1 are stop valves, while reference symbol 29 is a flow control valve.

In addition, a plurality of exhaust ports 33 are provided at prescribed intervals on the outside of cover 23b, and these exhaust ports 33 are connected to gas treatment means 34. Gas treatment means 34 has a first treatment container 51 connected to exhaust ports 33 via first conduit line 41 in which pellets of sodium hydroxide and so forth are stored, second treatment container 52 connected to first treatment container 51 via second conduit line 42 in which liquid nitrogen 52a is stored and which is cooled by this liquid nitrogen 52a, and suction pump 36 connected to second treatment container 52 via third conduit line 43 which aspirates the mixed gas and inert gas in chamber 23. In the first treatment container 51, gaseous fluoridation agent present in the mixed gas is trapped by sodium hydroxide and so forth, and in second treatment container 52, water formed by the reaction is cooled by liquid nitrogen 52a to form a solid so as to be trapped. Reference symbol 37 in FIG. 1 is a bypass conduit line, while reference symbols 44, 45, 46, 47, 48 and 49 are stop valves. In addition, the above discharge port 31d and exhaust ports 33 are disposed so that the gaseous fluoridation agent makes uniform contact. Furthermore, the above discharge port 31d and exhaust ports 33 may be formed into the shape of tubes, filters or nozzles.

The following provides an explanation of the operation of the manufacturing device for PDP protective film 100 composed in the manner described above.

A powder of alkaline earth oxide, rare earth oxide or a compound oxide thereof having a mean particle size of 50–2000 Å is produced in advance by a vapor phase method or liquid synthesis method. To begin with, after coating, spraying and then baking an electrode paste of Ag or Au and so forth to serve as display electrodes 16 at prescribed intervals on the surface of front glass substrate 13 by screen printing, a transparent glass paste to serve as transparent dielectric layer 17 on the surface of the above glass substrate 13 is coated and dried onto the entire surface of front glass substrate 13 by screen printing. Next, a film paste to serve as film body 14 is prepared by mixing at a prescribed ratio a powder of an alkaline earth oxide, rare earth oxide or compound oxide thereof, a binder and a solvent, and this paste is then coated and dried onto the entire surface of the above transparent dielectric layer 17 by screen printing.

Examples of substances used for the above binder include alkoxides, organic acid compounds and acetyl acetonates of alkaline earth metals and rare earth metals (such as organic acid magnesium, magnesium alkoxide and magnesium acetyl acetonate), or ethyl cellulose, ethyl silicate and so forth. Examples of substances used for the above solvent include α-terpineol, butyl carbitol, butyl carbitol acetate and terpine oil. In addition, the mixing ratio of the above power of alkaline earth oxide, rare earth oxide or compound oxide thereof, binder and solvent is preferably set to be 0–10% by weight, 10–100% by weight and 0–30% by weight, respectively. Next, the above front glass substrate is dried by holding in air for 10–60 minutes at 100–200° C., and then baked by holding in air for 10–60 minutes at 500–600° C.

This baked front glass substrate 13 is then housed in layer formation chamber 22 set to a prescribed temperature by placing on substrate holder 24, a mixed gas of gaseous fluoridation agent and inert gas is discharged from discharge port 31*d* into chamber 23, and this mixed gas makes contact with the surface of film body 14. At this time, by heating glass substrate 13 with substrate heating means 32, in addition to allowing the reaction between gaseous fluoridation agent and protective film 100 to proceed selectively, even if the above mixed gas makes contact with the other side of substrate 13 or the outgoing circuits around film body 14, the reactivity between the gaseous fluoridation agent in the mixed gas and substrate 13 is inhibited, thereby being able to prevent corrosion of substrate 13 by the gaseous fluoridation agent.

On the other hand, suction pump 36 is activated simultaneous to supply of mixed gas and inert gas into chamber 23, to aspirate the above mixed gas and inert gas and maintain the pressure inside chamber 23 at a prescribed level. In addition, gaseous fluoridation agent in the aspirated mixed gas is captured in first treatment container 51, and the water formed in first treatment container 51 is captured in second treatment container 52. Furthermore, the temperature in chamber 23 is set to 40–250° C., and preferably to 70–200° C., and the concentration of gaseous fluoridation agent in chamber 23 is set within the range of 0.01–100%, and preferably 0.1–10%. When this state is maintained for 0.1–10 minutes, the surface of film body 14 is modified and fluoride layer 15 is formed on the surface of film body 14.

Figure 4:
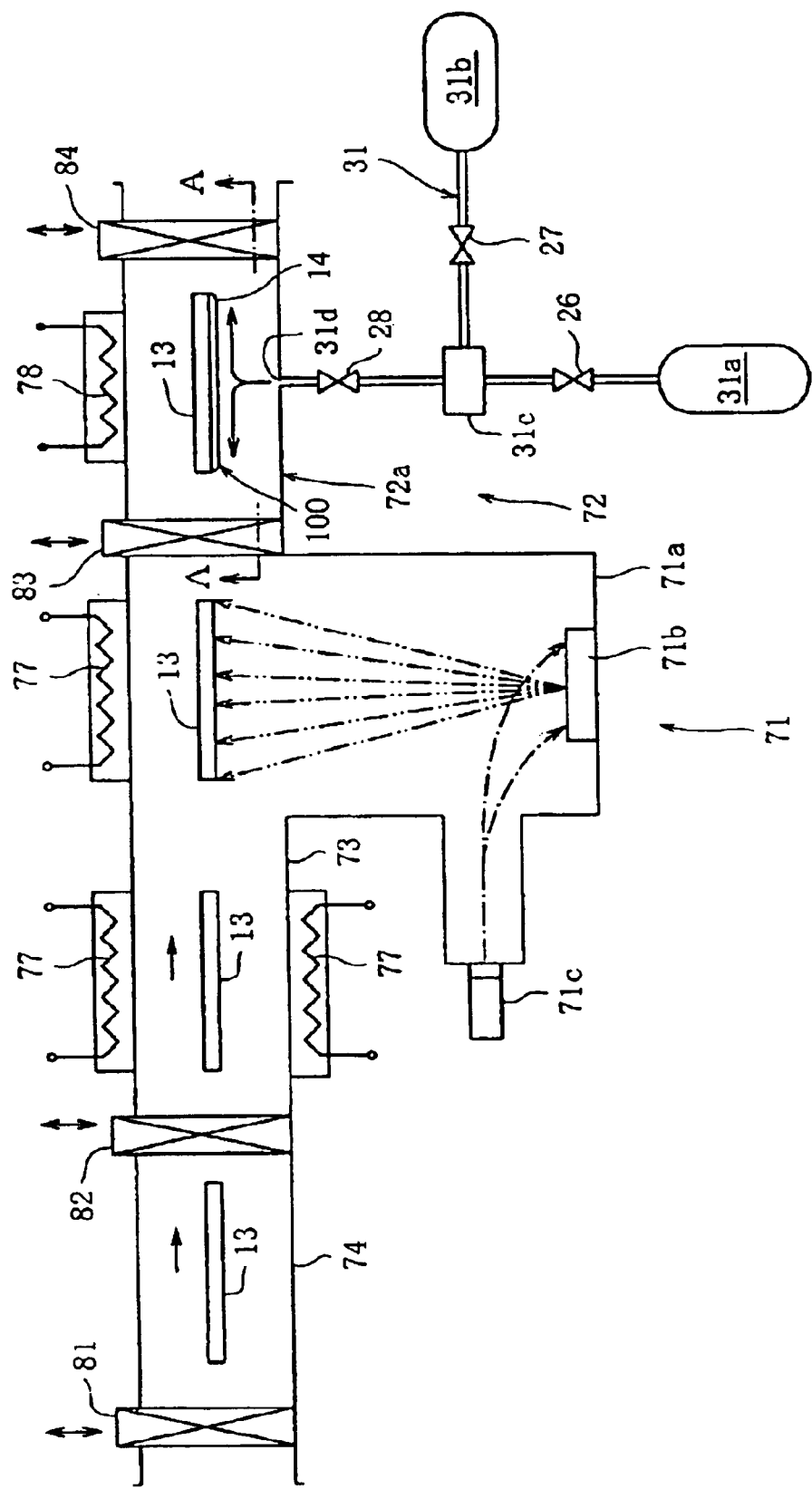
FIG. 4 is a cross-sectional block diagram corresponding to FIG. 1 showing another embodiment of the present invention.

FIG. 4 shows a fourth embodiment of the present invention. Those components in FIG. 4 that are the same as those in FIG. 1 are shown with the same reference symbols. This embodiment is composed such that a substrate transfer means transfers front glass substrate 13 from film formation means 71 to layer formation means 72 without exposing to the atmosphere (FIG. 4). Film formation means 71 is composed in this embodiment so as to form film body 14 on one side of substrate 13 by electron beam vapor deposition. Film formation means 71 has film formation chamber 71*a*, which houses substrate 13 in its upper portion, pellet container 71*b*, provided in the center of the bottom of this chamber 71*a* and which houses sintered body pellets of an alkaline earth oxide, rare earth oxide or compound oxide thereof having a purity of 99.5% or more, electron gun 71*c*, which shoots an electron beam towards the sintered body pellets in this container 71*b*, and substrate heating means 77 provided in film formation chamber 71*a* which heats substrate 13 in this chamber 71*a*. When an electron beam is shot from electron gun 71*c* onto the sintered body pellets in a state in which the inside of chamber 71*a* is held in an oxygen gas atmosphere at a prescribed pressure (preferably, nearly $1 \times 10^4$ Torr or less), the sintered body pellets are heated and the atoms that compose these pellets evaporate and are deposited on one side of substrate 13 (bottom side).

On the other hand, layer formation means 72 has layer formation chamber 72*a* that houses substrate 13, gas supply mechanism 31 that supplies gaseous fluoridation agent into this chamber 72*a* and forms a fluoride layer (not shown) on the surface of film body 14, and substrate heating means 78 provided in layer formation chamber 72*a* that heats substrate 13 in this chamber 72*a* Film formation chamber 71 is formed into the shape of a box, while layer formation chamber 72*a* is formed into shape of a box extended in the horizontal direction. Layer formation chamber 72*a* is connected to the right end of the upper portion of film formation chamber 71*a*, and pressure reduction chamber 74 is connected to the left end of the upper portion of film formation chamber 71 through preheating chamber 73. First and second shutters 81 and 82 are provided on both ends of pressure reduction chamber 74, each able to open and close, and third and fourth shutters 83 and 84 are provided on both ends of layer formation chamber 72*a*, each able to open and close. When first and second shutters 81 and 82 are closed, the inside of pressure reduction chamber 74 is kept airtight, when second and third shutters 82 and 83 are closed, the inside of preheating chamber 73 and film formation chamber 71*a* are kept airtight, and when third and fourth shutters 83 and 84 are closed, the inside of layer formation chamber 72*a* is kept airtight.

Gas supply mechanism 31 is composed in the same manner as the gas supply mechanism of the third embodiment, and has a first tank 31*a* in which a gaseous fluoridation agent such as hydrogen fluoride gas is stored, a second tank 31*b* in which an inert gas such as nitrogen gas is stored, a mass flow controller 31*c* that controls the mass flow volume of a mixed gas of gaseous fluoridation agent and inert gas at a constant level, and a discharge port 31*d* formed chamber 72*a* that discharges the above mixed gas into chamber 72*a*. In addition, a plurality of exhaust ports (not shown) are formed at prescribed intervals in both walls of chamber 72*a*, and these exhaust ports are connected to a gas treatment means (not shown). The gas treatment means is composed in the same manner as the gas treatment means of the first embodiment. Moreover, the above discharge port 31*d* and exhaust ports are disposed so that the gaseous fluoridation agent makes uniform contact with substrate 13. Furthermore, the above discharge port 31*d* and exhaust ports may be formed into the shape of tubes, filters or nozzles.

Although not shown, a substrate transfer means has a substrate holder that holds substrate 13, and a transport mechanism capable of sequentially transporting the substrate holder along with substrate 13 to pressure reduction chamber 74, preheating chamber 73, film formation chamber 71*a* and layer formation chamber 72*a*. Furthermore, substrate heating means 77 is not only provided on the outside of film formation chamber 71*a*, but also on the outside of preheating chamber 73, while substrate heating means 78 is provided on the outside of layer formation chamber 72. In addition, although the example of a film formation means that forms a film body by electron beam vapor deposition has been indicated in this embodiment, a film formation means may also be provided that forms the film body by sputtering or ion plating and so forth.

The following provides an explanation of the operation of the manufacturing device for PDP protective film 100 composed in the manner described above. To begin with, after coating, spraying and then baking an electrode paste of Ag or Au and so forth to serve as display electrodes 16 (not shown) at prescribed intervals on the surface of front glass substrate 13 by screen printing, a transparent glass paste to serve as a transparent dielectric layer (not shown) on the surface of the above glass substrate 13 is coated and dried onto the entire surface of substrate 13 by screen printing. Next, the above substrate 13 is dried by holding in air for 10–60 minutes at 100–200° C., and then baked by holding in air for 10–60 minutes at 500–600° C.

Next, first shutter 81 is opened and substrate 13 is placed in pressure reduction a chamber 74 after which first shutter 81 is closed and the pressure inside pressure reduction chamber 74 is reduced. Following completion of pressure reduction, second shutter 82 is opened, substrate 13 is transferred to preheating chamber 73, second shutter 82 is closed and substrate 13 is preheated to a prescribed temperature. This substrate 13 is then transferred to film formation chamber 71a where an electron beam from electron gun 71c is shot onto the sintered body pellets to evaporate the atoms that compose the pellets. The atoms are then vapor deposited so as to cover the surface of the transparent dielectric layer formed on one side of substrate 13 and form film body 14. The conditions for deposition of this film body 14 consist of an electron beam acceleration voltage of 5–30 kV, and a vapor deposition pressure of the deposited atoms and vapor deposition distance preferably within the respective ranges of $0.1 \times 10^{-2}$ to $10 \times 10^{-2}$ Pa and 100–1000 mm. In addition, the pressure in this chamber 71a is held to $10^{-3}$ Pa or less, and substrate 13 is preferably held in this chamber 71a for 5–20 minutes.

When the prescribed time has elapsed and film body 14 of a prescribed thickness is formed on one side (bottom side) of substrate 13, third shutter 83 is opened, substrate 13 is transferred to layer formation chamber 72a set to a prescribed temperature, and third shutter 83 is then closed. After returning the inside of chamber 72a to nearly atmospheric pressure with nitrogen gas while in this state, a mixed gas of gaseous fluoridation agent and inert gas is discharged into chamber 72a from discharge port 31d, and this mixed gas makes contact with the surface of film body 14. At this time, by heating substrate 13 with substrate heating means 78, in addition to allowing the reaction between gaseous fluoridation agent and protective film 100 to proceed selectively, even if the above mixed gas makes contact with the other side of substrate 13 or the outgoing circuits around film body 14, the reactivity between the gaseous fluoridation agent in the mixed gas and substrate 13 is inhibited, thereby being able to prevent corrosion of substrate 13 by the gaseous fluoridation agent.

On the other hand, suction pump 36 is activated simultaneous to supply of mixed gas and inert gas into chamber 72a to aspirate the above mixed gas and inert gas and maintain the pressure inside chamber 72a at a prescribed level. In addition, gaseous fluoridation agent in the aspirated mixed gas is captured in first treatment container 51, and gaseous fluoridation agent that has passed through first treatment container 51 is captured in second treatment container 52. Furthermore, the temperature in chamber 72a is set to 40–250° C., and preferably to 70–200° C., and the concentration of gaseous fluoridation agent in chamber 72a is set within the range of 0.01–100%, and preferably 0.1–10%. When this state is maintained for 0.1–10 minutes, the surface of film body 14 is modified and as fluoride layer is formed on the surface of film body 14. In addition, since substrate 13 is not exposed to the atmosphere when transferred from film formation chamber 71a to layer formation chamber 72a, the deterioration of MgO and so forth in film body 14 into $MgCO_3$ or $Mg(OH)_2$ and so forth, which are harmful to PDP, due to reacting with $CO_2$ gas and $H_2O$ gas in the atmosphere can be prevented.

Figure 5:
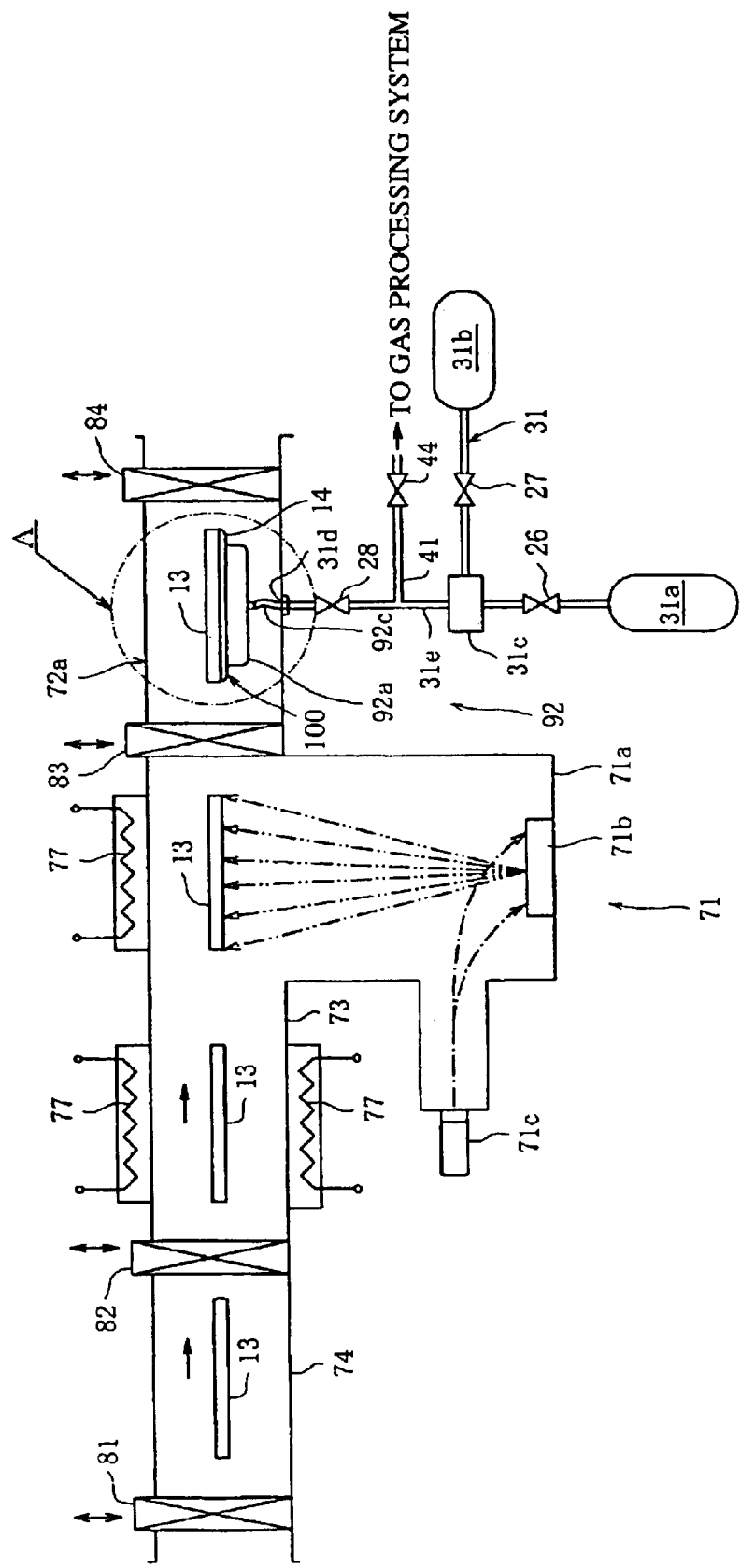
FIG. 5 is a cross-sectional block diagram corresponding to FIG. 4 showing another embodiment of the present invention.
Figure 6:
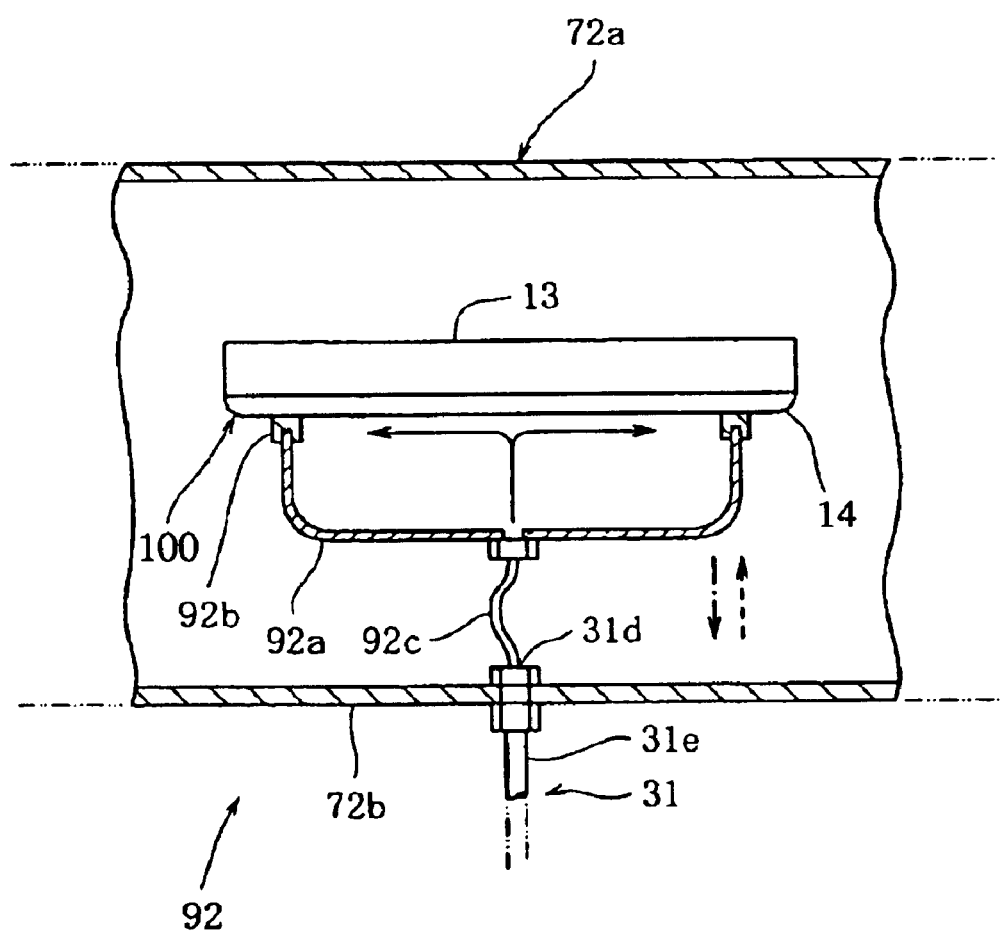
FIG. 6 is an enlarged cross-sectional view of portion A of FIG. 5.

FIGS. 5 and 6 show a fifth embodiment of the present invention. The same reference symbols used in FIG. 4 are used to indicate the same components in FIGS. 5 and 6.

In this embodiment, film formation means 71 (the same as that of the fourth embodiment) is equipped with layer formation means 92 that forms fluoride layer 15 on the surface of film body 14. Layer formation means 92 has layer formation chamber 72a that houses substrate 13 on which film body 14 has been formed, treatment dome 92a provided inside layer formation chamber 72a that is pressed against one side of substrate 13 to keep it airtight, and gas supply mechanism 31 that supplies gaseous fluoridation agent into treatment dome 92a and forms fluoride layer 15 on the surface of film body 14. The above treatment dome 92a is formed roughly into the shape of a bowl, the outside of which is slightly smaller than front glass substrate 13, so as to prevent contact by the gaseous fluoridation agent with the outgoing circuits around the periphery of film body 14, and is composed so as to be able to be raised and lowered by an elevator apparatus not shown. In addition, seal member 92b that adheres to substrate 13 is fit around the upper edge of treatment dome 92a, while the center of the lower edge of treatment dome 92a is connected to discharge port 31d of gas supply mechanism 31 by flexible hose 92c.

A stop valve 28, which opens and closes supply and exhaust conduit line 31e that connects discharge port 31d and mass flow controller 31c, is provided in this conduit line 31e. In addition, first conduit line 41, which branches from the above supply and exhaust conduit line 31e, is connected to a gas treatment means, and a stop valve 44, which opens and closes this first conduit line 41, is provided in this conduit line 41. Moreover, the above discharge port 31d is disposed so that the gas fluoridation agent makes uniform contact with one side of substrate 13, and the above discharge port 31d may be formed into the shape of a tube, filter or nozzle.

The following provides an explanation of the operation of the manufacturing device for FPD protective film 100 composed in the manner described above.

After film body 14 is formed on one side of front glass substrate 13 in film formation chamber 71a, third shutter 83 is opened, substrate 13 is transferred to layer formation chamber 72a, and then third shutter 83 is closed. Treatment dome 92a is then raised in chamber 72a in which a vacuum has been drawn in advance, and presses against one side (bottom side) of substrate 13. Stop valve 44 is closed and stop valves 26, 27 and 28 are opened so that a mixed gas of gaseous fluoridation agent and inert gas is discharged into treatment dome 92a from gas supply mechanism 31, enabling this mixed gas to make contact with the surface of film body 14. At this time, since the above mixed gas does not make contact with the other side (top side) of substrate 13 or the outgoing circuits around film body 14, corrosion of substrate 13 by the gaseous fluoridation agent in the mixed gas can be prevented.

After sealing the above mixed gas in the treatment dome at a constant pressure, stop valves 26, 27 and 28 are closed. When held in this state for a prescribed amount of time (0.1–10 minutes), the surface of film body 14 is modified and fluoride layer 15 is formed on the surface of film body 14. After a prescribed amount of time has elapsed, stop valves 28 and 44 are opened, a suction pump (not shown) of a gas treatment means is activated, mixed gas in treatment dome 92*a* is aspirated, and treatment is performed by the gas treatment means in the same manner as the second embodiment. As previously mentioned, since substrate 13 is not exposed to the atmosphere when transferred from film formation chamber 71*a* to layer formation chamber 72*a*, the deterioration of MgO and so forth in film body 14 into $MgCO_3$ or $Mg(OH)_2$ and so forth, which are harmful to PDP, due to reacting with $CO_2$ gas and $H_2O$ gas in the atmosphere can be prevented. Since operation other than that described above is nearly the same as that of the second embodiment, repetition of its explanation is omitted.

Furthermore, although the constitution of the manufacturing device of the present invention may be either of the batch type in which substrates are exposed to the atmosphere following deposition (third embodiment), or of the inline type in which substrates are not exposed to the atmosphere following deposition (fourth and fifth embodiments) as previously described, in the case of a batch type, performing fluoridation treatment after heating the film body and removing surface contamination results in improved fluorine modification effects.

In addition, as was described above, the method of introducing gaseous fluoridation agent may be either the above-mentioned dynamic method, in which a fixed concentration of gaseous fluoridation agent is introduced into a layer formation chamber at nearly atmospheric pressure and allowed to flow inside the chamber (third and fourth embodiments), or a sealing method in which gaseous fluoridation agent at a fixed pressure is sealed inside a treatment dome followed by evacuating the inside of the treatment dome (fifth embodiment).

In addition, as previously described, the method for protecting the display side of the front glass substrate (side opposite the side on which the film body has been formed) and outgoing circuits formed around the film body of the protective film may be either a selective reaction method in which the reaction between gaseous fluoridation agent and FPD protective film is allowed to proceed selectively by heating the substrate (first and second embodiments), or a chucking method in which a bowl-shaped treatment dome is placed over the treated surface and fluorine gas is introduced inside this dome (fifth embodiment).

Moreover, although varying according to the type of gaseous fluoridation agent, a method in which exhaust gas is adsorbed and removed by a solid trap or a method in which the exhaust gas is absorbed with a scrubber is typically employed for the exhaust gas treatment method.

Next, the following provides a detailed explanation of the examples of the present invention along with comparative examples. However, the present invention is not limited to the following examples, and may be of any form provided it does not exceed the scope of the present invention, To begin with, the following describes examples of vapor deposition materials using a sintered body, and said sintered body may be a single crystal.

COMPARATIVE EXAMPLES 1–29

Powders were prepared consisting of one type or two or more types of oxides selected from MgO, CaO, SrO, BaO, alkaline earth composite oxides, rare earth oxides and composite oxides of alkaline earth oxides and rare earth oxides shown in the material column a of Tables 3 and 4. Binder in the form of polyvinyl butyral and dispersant in the form of ethanol were added to this powder, and the resulting mixture was wet-mixed for 1 hour with a agitating mill to prepare a mixed slurry having a concentration of 50%. This mixed slurry was spray-dried with a spray dryer to granulate and obtained a granulated powder. This granulated powder was filled into a metal mold (having an inner diameter of 6 mm and depth of 3 mm), and molded with a mechanical press to obtain a compact. This compact was heated to 1650° C. in air and sintered for 3 hours in a sintering furnace (Kochiku Ltd.) to obtain polycrystalline body 111 having a diameter of about 5 mm. Vapor deposition materials composed of these compacts 111 that did not have a fluoride layer 112 were designated as Comparative Examples 1–29.

EXAMPLES 1–29

A plurality of types of polycrystalline body 111 identical to Comparative Examples 1–29 were obtained according to the same procedure as Comparative Examples 1–29. This plurality of types of polycrystalline body 111 were held for 10 minutes in an HF gas atmosphere (temperature: 25° C.) at a pressure of 35 Torr to reform the respective surfaces of polycrystalline body 111 and respectively form fluoride layer 112 on the surface of polycrystalline body 111. Vapor deposition materials 110, in which the surface of polycrystalline body 111 was covered with fluoride layer 112 in this manner, were designated as Examples 1–29. The materials of each polycrystalline body 111 in Examples 1–29 are shown in Tables 1 and 2.

Comparative Test 1

The weight of each vapor deposited material 110 in Comparative Examples 1–29 and Examples 1–29 was measured at the time it was obtained, each material was then allowed to stand in air for 7 days, the weight of each material was again measured 7 days later, and the weight gain rate (%) was calculated. Those results are shown in Tables 1 through 4.

Comparative Test 2

Next, films were deposited on glass substrate 21 by electron beam vapor deposition using each of the vapor deposition materials 110 in Comparative Examples 1–29 and Examples 1–29 allowed to stand for 7 days in air. Furthermore, deposition conditions for protective film 24 consisted of placing vapor deposition material 110 in a vacuum film deposition container followed by performing degassing exhaust treatment for 10 minutes while heating the vapor deposition material, and depositing under conditions of an acceleration voltage of 15 kV, vapor deposition pressure of $1 \times 10^{-2}$ Pa and vapor deposition distance of 600 mm.

The deposition rate and relative density of the film on glass substrate 20 were measured using the methods indicated below. Namely, deposition rate (Å/sec) was calculated by determining the film thickness (Å) by observing a cross-section of the resulting film by high-resolution SEM, and dividing the film thickness (Å) by deposition time (sec). Relative density (%) was calculated according to the ratio with the true density (g/cm³) of the material. In the case the vapor deposition material was composed of a simple mixture of two components (for example, MgO and CaO), the abundance ratio of component A and component B was determined, and true density of the film was calculated as $\{X\alpha + (1-X)\beta\}$ (g/cm³) in the case of representing component A (true density: $\alpha$ g/cm³) with X, and representing component B (true density: $\beta$ g/cm³) with (1−X). Those results are shown in Tables 1 through 4.

TABLE 1

| Example | Material | Weight gain rate after 7 days (%) | Deposition rate (Å/sec) | Relative density (%) |
|---|---|---|---|---|
| 1 | MgO | 0.1 or less | 14 | 90 |
| 2 | CaO | 0.1 | 12 | 91 |
| 3 | SrO | 0.2 | 10 | 88 |
| 4 | BaO | 0.1 | 10 | 86 |
| 5 | (Ca.Sr)O | 0.2 | 12 | 89 |
| 6 | (Mg.Sr)O | 0.1 | 13 | 92 |
| 7 | (Sr.Ba)O | 0.2 | 10 | 90 |
| 8 | $Y_2O_3$ | 0.1 or less | 6 | 91 |
| 9 | $Gd_2O_3$ | 0.1 or less | 5 | 86 |
| 10 | $Dy_2O_3$ | 0.1 or less | 5 | 85 |
| 11 | $CeO_2$ | 0.1 or less | 6 | 88 |
| 12 | $La_2O_3$ | 0.1 or less | 7 | 90 |
| 13 | $Yb_2O_3$ | 0.1 or less | 5 | 93 |
| 14 | $MgGd_2O_4$ | 0.1 or less | 5 | 85 |
| 15 | $MgY_2O_4$ | 0.1 or less | 4 | 82 |

TABLE 2

| Example | Material | Weight gain rate after 7 days (%) | Deposition rate (Å/sec) | Relative density (%) |
|---|---|---|---|---|
| 16 | $MgLa_2O_4$ | 0.2 | 5 | 90 |
| 17 | $CaGd_2O_4$ | 0.1 | 3 | 86 |
| 18 | $CaY_2O_4$ | 0.2 | 3 | 83 |
| 19 | $CaLa_2O_4$ | 0.3 | 4 | 90 |
| 20 | $SrGd_2O_4$ | 0.2 | 3 | 91 |
| 21 | $SrY_2O_4$ | 0.2 | 2 | 93 |
| 22 | $SrLa_2O_4$ | 0.1 | 3 | 87 |
| 23 | $BaGd_2O_4$ | 0.2 | 3 | 88 |
| 24 | $BaY_2O_4$ | 0.3 | 4 | 90 |
| 25 | $BaLa_2O_4$ | 0.2 | 3 | 89 |
| 26 | $MgO:LaB_6$ | 0.1 | 12 | 92 |
| 27 | $MgO:La_2O_3$ | 0.1 or less | 10 | 93 |
| 28 | $MgO:Sc_2O_3$ | 0.1 or less | 9 | 90 |
| 29 | $MgO:Y_2O_3$ | 0.1 or less | 10 | 89 |

TABLE 3

| Comparative Example | Material | Weight gain rate after 7 days (%) | Deposition rate (Å/sec) | Relative density (%) |
|---|---|---|---|---|
| 1 | MgO | 0.5 | 10 | 80 |
| 2 | CaO | 2 | 6 | 81 |
| 3 | SrO | 3 | 3 | 78 |
| 4 | BaO | 3 | 4 | 80 |
| 5 | (Ca.Sr)O | 3 | 3 | 80 |
| 6 | (Mg.Sr)O | 2 | 2 | 81 |
| 7 | (Sr.Ba)O | 5 | 3 | 78 |
| 8 | $Y_2O_3$ | 0.3 | 2 | 75 |
| 9 | $Gd_2O_3$ | 0.3 | 2 | 80 |
| 10 | $Dy_2O_3$ | 0.2 | 3 | 80 |
| 11 | $CeO_2$ | 0.5 | 2 | 82 |
| 12 | $La_2O_3$ | 0.2 | 5 | 85 |
| 13 | $Yb_2O_3$ | 0.3 | 3 | 79 |
| 14 | $MgGd_2O_4$ | 0.4 | 3 | 76 |
| 15 | $MgY_2O_4$ | 0.4 | 2 | 82 |

TABLE 4

| Comparative Example | Material | Weight gain rate after 7 days (%) | Deposition rate (Å/sec) | Relative density (%) |
|---|---|---|---|---|
| 16 | $MgLa_2O_4$ | 1 | 3 | 80 |
| 17 | $CaGd_2O_4$ | 0.7 | 2 | 80 |
| 18 | $CaY_2O_4$ | 0.8 | 2 | 77 |
| 19 | $CaLa_2O_4$ | 2 | 2 | 82 |

TABLE 4-continued

| Comparative Example | Material | Weight gain rate after 7 days (%) | Deposition rate (Å/sec) | Relative density (%) |
|---|---|---|---|---|
| 20 | $SrGd_2O_4$ | 2 | 1 | 83 |
| 21 | $SrY_2O_4$ | 3 | 2 | 82 |
| 22 | $SrLa_2O_4$ | 3 | 2 | 80 |
| 23 | $BaGd_2O_4$ | 32 | 1 | 77 |
| 24 | $BaY_2O_4$ | 3 | 1 | 81 |
| 25 | $BaLa_2O_4$ | 3 | 2 | 83 |
| 26 | $MgO:LaB_6$ | 0.5 | 8 | 82 |
| 27 | $MgO:La_2O_3$ | 1 | 8 | 86 |
| 28 | $MgO:Sc_2O_3$ | 0.7 | 6 | 83 |
| 29 | $MgO:Y_2O_3$ | 0.7 | 7 | 83 |

As is clear from Tables 1 through 4, the weight gain rates of Examples 1–29 corresponding to Comparative Examples 1–29 can be seen to be significantly lower in comparison with Comparative Examples 1–29. Since the weight of the vapor deposition material increases as a result of deterioration due to the sintered body reacting with $CO_2$ and $H_2O$ in the air, the surface of the vapor deposition material in Comparative Examples 1–29 having high weight gain ratios can be understood to have deteriorated considerably. On the other hand, since the weight gain ratios of the vapor deposition materials in Examples 1–29 are remarkably low, the degree of deterioration of their sintered bodies can be understood to be low in comparison with Comparative Examples 1–29. This is considered to be due to the surface of the sintered bodies being covered with a fluoride layer.

In addition, the deposition rates of Examples 1–29 are higher as compared with Comparative Examples 1–29, and the relative densities can also be seen to be higher. This is thought to be due to the vapor deposition materials of Examples 1–29 exhibiting less generation of impurity gas in comparison with the vapor deposition materials of Comparative Examples 1–29 during deposition of protective film 24. As a result, FPD in which a protective film is formed using a vapor deposition material of the present invention can be understood to have high sputtering resistance of the film and improved service life.

Continuing, the following describes examples of protective films fabricated from vapor deposition materials like those described above.

EXAMPLE 30

To begin with, as shown in FIG. 7, after forming Ag display electrodes 16 (film thickness: 54 µm) on the surface of front glass substrate 13 having a thickness of 3 mm by screen printing, transparent dielectric layer 17 made of glass (film thickness: 20 µm) was formed by screen printing. Next, after drying this glass substrate 13 by holding for 30 minutes in air at 150° C., it was baked by holding for 30 minutes in air at 550° C. Next, MgO sintered body pellets having a purity of 99.99% were deposited by electron beam vapor deposition so as to cover the surface of transparent dielectric layer 17 on the above glass substrate 13 and form film body 14 in the form of an aggregate of a plurality of columnar crystallites 14a. Deposition conditions of this film body 14 consisted of an acceleration voltage of 10 kV, vapor deposition pressure of $1 \times 10^{-2}$ Pa and vapor deposition distance of 400 mm. Moreover, the peripheral side surfaces and apices of the plurality of columnar crystallites 14a that compose film body 14 were modified by holding this glass substrate 13 for 1 minute in an HF gas atmosphere at a pressure of 10 Torr (temperature: 80° C.), and fluoride layer 15 was formed on the peripheral side surfaces and apices of the plurality of columnar crystallites 14a. This glass substrate 13 was designated as Example 30.

EXAMPLE 31

After forming film body 14 in the form of an aggregate of a plurality of columnar crystallites 14a on the surface of a glass substrate by electron beam vapor deposition in the same manner as Example 30, this glass substrate was held for 10 minutes in an HF gas atmosphere (temperature: 80° C.) at a pressure of 50 Torr to modify the surface of the film body and form fluoride layer 15 on the surface of film body 14. This glass substrate was designated as Example 31.

EXAMPLE 32

After forming a film body on the surface of a glass substrate by electron beam vapor deposition in the same manner as Example 30, this glass substrate was held for 1 minute in an $F_2$ gas atmosphere (temperature: 25° C.) at a pressure of 10 Torr to modify the surface of the film body and form a fluoride layer on the surface of the film body. This glass substrate was designated as Example 32.

EXAMPLE 33

A glass substrate on which was formed transparent dielectric layer 17 was obtained in the same manner as Example 30. Sintered body pellets of (Mg,Ca)O having a purity of 99.9% were vapor deposited so as to cover the surface of transparent dielectric layer 17 of the above glass substrate 13 by electron beam vapor deposition, and form film body 14 in the form of an aggregate of a plurality of columnar crystallites 14a Deposition conditions of this film body 14 consisted of an acceleration voltage of 10 kV, vapor deposition pressure of $1 \times 10^{-2}$ Pa and vapor deposition distance of 400 mm. Moreover, the peripheral side surfaces and apices of the plurality of columnar crystallites 14a that compose film body 14 were modified by holding this glass substrate 13 for 10 minutes in an HF gas atmosphere at a pressure of 50 Torr (temperature: 80° C.), and fluoride layer 15 was formed on the peripheral side surfaces and apices of the plurality of columnar crystallites 14a. This glass substrate was designated as Example 33.

EXAMPLE 34

A glass substrate on which was formed transparent dielectric layer 17 was obtained in the same manner as Example 30. Sintered body pellets of CaO having a purity of 99.8% were vapor deposited so as to cover the surface of transparent dielectric layer 17 of the above glass substrate 13 by electron beam vapor deposition, and form film body 14 in the form of an aggregate of a plurality of columnar crystallites 14a. Deposition conditions of this film body 14 consisted of an acceleration voltage of 12 kV, vapor deposition pressure of $1 \times 10^{-2}$ Pa and vapor deposition distance of 400 mm. Moreover, the peripheral side surfaces and apices of the plurality of columnar crystallites 14a that compose film body 14 were modified by holding this glass substrate 13 for 10 minutes in an HF gas atmosphere at a pressure of 50 Torr (temperature: 80° C.), and fluoride layer 15 was formed on the peripheral side surfaces and apices of the plurality of columnar crystallites 14a. This glass substrate was designated as Example 34.

COMPARATIVE EXAMPLE 30

Although a film body in the form of an aggregate of a plurality of columnar crystallites 14a was formed on the surface of a glass substrate by electron beam vapor deposition in the same manner as Example 30 using the same MgO sintered body pellets of Example 30, the surface of the film body was not modified. This glass substrate was designated as Comparative Example 30.

COMPARATIVE EXAMPLE 31

Although a film body in the form of an aggregate of a plurality of columnar crystallites 14a was formed on the surface of a glass substrate by electron beam vapor deposition in the same manner as Example 33 using the same (Mg,Ca)O sintered body pellets of Example 33, the surface of the film body was not modified. This glass substrate was designated as Comparative Example 31.

COMPARATIVE EXAMPLE 32

Although a film body in the form of an aggregate of a plurality of columnar crystallites 14a was formed on the surface of a glass substrate by electron beam vapor deposition in the same manner as Example 34 using the same CaO sintered body pellets of Example 34, the surface of the film body was not modified. This glass substrate was designated as Comparative Example 32.

Comparative Test 3 and Evaluation

Diameter x of the columnar crystallites that compose the film bodies on the glass substrates of Examples 30–34 was measured by observing with a scanning electron microscope, and thickness y of the fluoride layer formed on the peripheral side surfaces and apices of the columnar crystallites was calculated from the number of fluorine atoms as determined by performing elementary analysis in the direction of depth by X-ray photoelectron spectrometry. The ratio y/x of the thickness y of the fluoride layer to diameter x of the columnar crystallites was then determined on the basis of those results. In addition, the degassed amounts of the film bodies on the glass substrates of Examples 30–34 and Comparative Examples 30–32 were investigated. Degassed amounts were evaluated by expressing the peak area of eliminated gas in relative units (au.: arbitrary units) using a heating elimination gas analyzer. Thus, the smaller the above relative value of the peak area of eliminated gas, the better the environmental resistance of the film body. Moreover, the discharge starting voltage (Vf) of the film bodies was measured by placing the glass substrates of Examples 30–34 and Comparative Examples 30–32 in a chamber, evacuating the air from inside this chamber, filling the chamber with an Ne-4% Xe mixed gas at 500 Torr, and applying a voltage of 20 kHz. Those measurement results are shown in Table 5.

TABLE 5

| | Film body material | Film body modification conditions | | | | Diameter of columnar crystallite (nm) | Thickness of fluoride layer (nm) | Ratio of thickness of fluoride layer/diameter of columnar crystallite (y/x) | Degassing amount Carbonates (a.u.) | Discharge starting voltage Vf (V) |
|---|---|---|---|---|---|---|---|---|---|---|
| | | Temperature (° C.) | Time (min) | Gas | Partial pressure (Torr) | | | | | |
| Ex. 1 | MgO | 80 | 1 | HF | 10 | 60 | 3.0 | 0.05 | 0.10 | 174 |
| Ex. 2 | MgO | 80 | 10 | HF | 50 | 60 | 6.0 | 0.1 | 0.12 | 175 |
| Ex. 3 | MgO | 25 | 1 | $F_2$ | 10 | 60 | 3.0 | 0.05 | 0.13 | 176 |
| Ex. 4 | (Mg, Ca)O | 80 | 10 | HF | 50 | 60 | 6.0 | 0.1 | 0.12 | 162 |
| Ex. 5 | CaO | 80 | 10 | HF | 50 | 60 | 6.0 | 0.1 | 0.20 | 162 |
| Com. Ex. 1 | MgO | — | — | — | — | — | — | — | 1.0 | 180 |
| Com. Ex. 2 | (Mg, Ca)O | — | — | — | — | — | — | — | 1.3 | 175 |
| Com. Ex. 3 | CaO | — | — | — | — | — | — | — | 1.6 | 170 |

As is clear from Table 5, in contrast to the relative values of the peak areas of eliminated gas being comparatively high in Comparative Examples 30–32, Examples 30–34 exhibited lower values as compared with the corresponding comparative examples at 0.1–0.2 a.u. This is thought to be due to a fluoride layer having formed on the peripheral side surfaces and apices of the columnar crystallites that compose the film body. In addition, in contrast to the discharge starting voltage being 180 V in Comparative Example 30, it was slightly lower at 174 V in Example 30 corresponding to Comparative Example 30, while in contrast to it being 175 V in Comparative Example 31, it was lower at 162 V in Example 33 corresponding to Comparative Example 31. In addition, in contrast to it being 170 V in Comparative Example 32, it was lower at 162 V in Example 34 corresponding to Comparative Example 32. On the basis of these results, secondary electron discharge capacity was increased and PDP performance was improved by the invention of the present application.

What is claimed is:

1. An FPD protective film comprising
    a film body formed from one or more oxides selected from the group consisting of MgO, CaO, SrO, BaO, an alkaline earth composite oxide, a rare earth oxide, and a composite oxide of alkaline earth oxides and rare earth oxides, on a surface of a substrate, and
    a fluoride layer formed on a surface of said film body,
    wherein said film body is an aggregate of a plurality of columnar crystallites densely standing on the surface of said substrate, and
    said fluoride layer is formed on peripheral side surfaces and top surfaces of said plurality of columnar crystallites.

2. The FPD protective film according to claim 1, wherein said fluoride layer is $MO_XF_Y$, wherein M is one or more selected from the group consisting of Mg, Ca, Sr, Ba, an alkaline earth compound metal, a rare earth metal and a compound metal of an alkaline earth metal and a rare earth metal, and $0 \leq X < 2$ and $0 < Y \leq 4$.

3. The FPD protective film according to claim 1, wherein said fluoride layer is obtained by reacting a fluoridation agent with one or more oxides selected from the group consisting of MgO, CaO, SrO, BaO, an alkaline earth composite oxide, a rare earth oxide, and a composite oxide of alkaline earth oxides and rare earth oxides.

4. The FPD protective a according to claim 3, wherein said fluoridation agent is one or more selected from the group consisting of fluorine gas, hydrogen fluoride gas, $BF_3$, $SbF_4$ and $SF_4$.

5. The FPD protective film according to claim 1, wherein a ratio (y/x) of a thickness of said fluoride layer (y) to a diameter of said columnar crystallites (x) is from 0.001 to 0.2.

6. The FPD protective film according to claim 1, wherein the fluoride layer is from 0.1 nm to 100 μm.

7. The FPD protective film according to claim 1, wherein the fluoride layer is from 1 nm to 1 μm.

8. The FPD protective film according to claim 1, wherein the columnar crystallites have a circular, triangular or polygonal shape.

9. An FPD comprising a substrate having a protective film on a surface thereof, said protective film comprising
    a film body formed from one or more oxides selected from the group consisting of MgO, CaO, SrO, BaO, an alkaline earth composite oxide, a rare earth oxide, a composite oxide of an alkaline earth oxide and a rare earth oxide, on a surface of a substrate, and
    a fluoride layer formed on a surface of said film body,
    wherein said film body is an aggregate of a plurality of columnar crystallites densely standing on the surface of said substrate, and
    said fluoride layer is formed on peripheral side surfaces and top surfaces of said plurality of columnar crystallites.

10. The FPD according to claim 9, wherein said fluoride layer is $MO_XF_Y$, wherein M is one or more selected from the group consisting of Mg, Ca, Sr, Ba, an alkaline earth metal and a rare earth metal, and $0 \leq X < 2$ and $0 < Y \leq 4$.

11. The FPD according to claim 9, wherein said fluoride layer is obtained by reacting a fluoridation agent with one or more oxides selected from the group consisting of MgO, CaO, SrO, BaO, an alkaline earth composite oxide, a rare earth oxide, a composite oxide of an alkaline earth oxide and a rare earth oxide.

12. The FPD according to claim 11, wherein said fluoridation agent is one or more selected from the group consisting of fluorine gas, $BF_3$, $SbF_4$ and $SF_4$.

13. The FPD according to claim 9, wherein a ratio (y/x) of a thickness of said fluorine layer (y) to a diameter of said columnar crystallites (x) is from 0.001 to 0.2.

* * * * *